(12) United States Patent
Nagura

(10) Patent No.: US 9,354,089 B2
(45) Date of Patent: May 31, 2016

(54) ENCODER

(75) Inventor: Chihiro Nagura, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 449 days.

(21) Appl. No.: 13/446,153

(22) Filed: Apr. 13, 2012

(65) Prior Publication Data

US 2012/0265484 A1 Oct. 18, 2012

(30) Foreign Application Priority Data

Apr. 14, 2011 (JP) ................................. 2011-089795

(51) Int. Cl.
*G01B 11/04* (2006.01)
*G01D 5/347* (2006.01)
*H03M 1/14* (2006.01)
*H03M 1/22* (2006.01)

(52) U.S. Cl.
CPC ............ *G01D 5/34746* (2013.01); *G01D 5/347* (2013.01); *G01D 5/34715* (2013.01); *G01D 5/34792* (2013.01); *H03M 1/143* (2013.01); *H03M 1/22* (2013.01)

(58) Field of Classification Search
USPC ........................................................ 702/150
See application file for complete search history.

(56) References Cited

U.S. PATENT DOCUMENTS

| 4,291,976 A | 9/1981 | McMahon |
| 5,069,547 A | 12/1991 | Huggins et al. |
| 5,699,058 A | 12/1997 | Yanagisawa et al. |
| 5,889,280 A | 3/1999 | Matsuura |
| 6,707,029 B1 * | 3/2004 | Fuwa .................... 250/237 G |
| 6,765,195 B1 * | 7/2004 | Leviton ................. 250/231.13 |
| 7,404,259 B2 | 7/2008 | Hermann |
| 8,188,420 B2 | 5/2012 | Lee |
| 8,309,906 B2 | 11/2012 | Kapner et al. |
| 2001/0011699 A1 * | 8/2001 | Aoki ...................... 250/231.13 |

(Continued)

FOREIGN PATENT DOCUMENTS

| DE | 102007025238 A1 | 12/2007 |
| EP | 2 093 543 A2 | 8/2009 |

(Continued)

OTHER PUBLICATIONS

European Extended Search Report issued in application No. EP12163894.4, dated Jul. 23, 2014. Cited in related U.S. Appl. No. 13/446,587.

(Continued)

*Primary Examiner* — Paul D Lee
(74) *Attorney, Agent, or Firm* — Rossi, Kimms & McDowell LLP

(57) ABSTRACT

An encoder includes a scale, a detector array that includes a plurality of detectors, and a signal processor configured to process and convert into positional information, an output signal from the detector array. The signal processor includes a first phase acquirer configured to acquire a first phase of a first modulation period from an output signal of the detector array. The encoder further includes a weighting unit configured to weight an output signal from each of a plurality of detectors using a weight in accordance with a position of the detector array. The weight is set so that in a predetermined range that contains a spatial frequency corresponding to the second modulation period in a spatial frequency response of the first phase acquirer, a value weighted by the weighting unit is equal to or smaller than a non-weighted value.

13 Claims, 20 Drawing Sheets

(56) References Cited

U.S. PATENT DOCUMENTS

| | | | |
|---|---|---|---|
| 2002/0014581 A1* | 2/2002 | Yamamoto et al. | 250/231.13 |
| 2007/0278392 A1 | 12/2007 | Toh et al. | |
| 2011/0266424 A1* | 11/2011 | Kawatoko et al. | 250/229 |
| 2011/0304482 A1* | 12/2011 | Kapner et al. | 341/13 |
| 2012/0261561 A1 | 10/2012 | Horiguchi et al. | |
| 2012/0261562 A1 | 10/2012 | Nagura | |
| 2012/0262731 A1 | 10/2012 | Nagura | |

FOREIGN PATENT DOCUMENTS

| | | |
|---|---|---|
| EP | 2511669 A2 | 10/2012 |
| GB | 2116313 B | 9/1983 |
| JP | 55030603 A | 3/1980 |
| JP | 58157203 A | 9/1983 |
| JP | 63063916 A | 3/1988 |
| JP | 63063917 A | 3/1988 |
| JP | 63065315 A | 3/1988 |
| JP | 63065316 A | 3/1988 |
| JP | 01229905 A | 9/1989 |
| JP | 0295203 A | 4/1990 |
| JP | 09-196705 A | 7/1997 |
| JP | 2007040996 A | 2/2007 |
| JP | 2007-248359 A | 9/2007 |
| JP | 2008076199 A | 4/2008 |
| JP | 2009-198318 A | 9/2009 |

OTHER PUBLICATIONS

European Extended Search Report issued in application No. EP12163898.5, dated Jul. 23, 2014. Cited in related U.S. Appl. No. 13/444,934.

European Extended Search Report issued in application No. EP12163893.6, dated Jul. 23, 2014. Cited in related U.S. Appl. No. 13/446,057.

European Extended Search Report issued in European counterpart application No. EP12163899.3, dated Jul. 23, 2014.

Official Action issued in JP2011-089745, mailed Jan. 20, 2015.

Office Action issued in U.S. Appl. No. 13/444,934, mailed Apr. 14, 2014.

Notice of Allowance issued in U.S. Appl. No. 13/444,934, mailed Sep. 10, 2014.

Office Action issued in U.S. Appl. No. 13/444,934, mailed on Dec. 31, 2014.

Notice of Allowance issued in U.S. Appl. No. 13/446,587, mailed on Sep. 15, 2014.

Office Action issued in U.S. Appl. No. 13/446,057, mailed on Apr. 9, 2014.

Office Action issued in U.S. Appl. No. 13/446,057, mailed on Sep. 3, 2014.

Office Action issued in U.S. Appl. No. 13/446,057, mailed on Dec. 31, 2014.

Notice of Allowance issued in U.S. Appl. No. 13/446,587, mailed on Jan. 13, 2015.

Office Action issued in U.S. Appl. No. 13/446,587, mailed on Apr. 4, 2014.

Official Action issued in JP2011-089728, mailed Feb. 3, 2015.

Official Action issued in JP2011-089795, mailed Feb. 3, 2015.

Japanese Office Action issued in related application No. JP2012-089035, dated Mar. 1, 2016.

* cited by examiner

ENCODER

BACKGROUND OF THE INVENTION

1. Field of the Invention

The present invention relates to an encoder.

2. Description of the Related Art

In order to improve the detecting precision of an absolute encoder like an incremental encoder, Japanese Patent Laid-Open No. ("JP") 2009-198318 forms such an incremental pattern on each track on a scale that a shape or pitch of the pattern periodically changes at a modulation period in a length measuring direction. Thereby, the incremental pattern has not only information of a relative position but also modulation information of an absolute position using a repetitive modulation period. As a result, the absolute position of the scale can be highly precisely detected using information of a highly precise relative position and the less reliable, absolute position information.

However, JP 2009-198318 obtains a signal of a different period from an incremental pattern on each track, and thus the obtained phase accuracy of the incremental signal may lower due to mounting height offsets between the light source and the light receiving element, and an image magnification error caused by an inclination between the scale and the light receiving element. As a result, the position of the scale cannot be precisely detected.

SUMMARY OF THE INVENTION

The present invention provides an encoder that can precisely detect a position of a scale.

An encoder according to the present invention includes a scale that includes a pattern row that has a plurality of patterns configured to spatially modulate an energy distribution, a detector array that includes a plurality of detectors that are configured to detect the energy distribution from the pattern row and arranged in a moving direction, the detector array being configured to move relatively to the scale, and a signal processor configured to process and convert into positional information, an output signal from the detector array. The pattern row has a first modulation period and a second modulation period different from the first modulation period in the moving direction. The signal processor includes a first phase acquirer configured to acquire a first phase of the first modulation period based on the output signal of the detector array. The encoder further includes a weighting unit configured to weight an output signal from each of a plurality of detectors using a weight in accordance with a position of the detector array. The weight is set so that in a predetermined range that contains a spatial frequency corresponding to the second modulation period in a spatial frequency response of the first phase acquirer, a value weighted by the weighting unit is equal to or smaller than a non-weighted value.

Further features of the present invention will become apparent from the following description of exemplary embodiments with reference to the attached drawings.

DESCRIPTION OF THE EMBODIMENTS

A description will now be given of embodiments of the present invention with reference to the accompanying drawings.

First Embodiment

Figure 1:
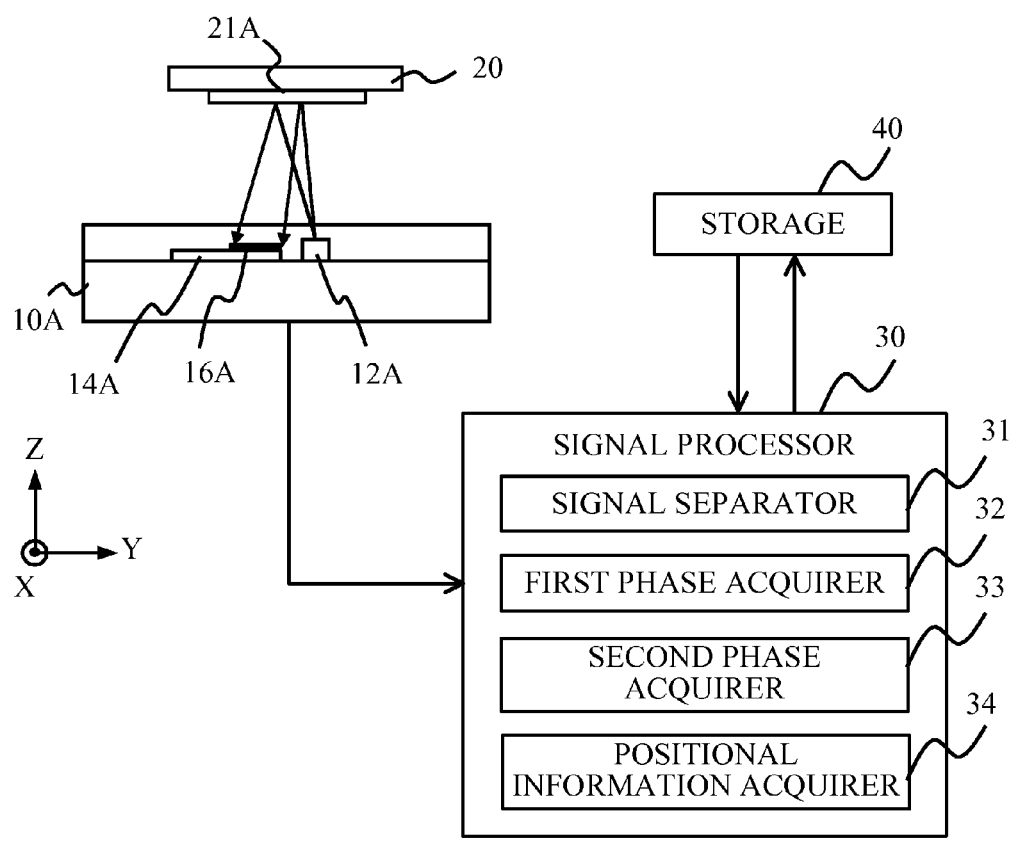
FIG. 1 is a block diagram of an encoder according to a first embodiment.

FIG. 1 is a block diagram of an optical encoder according to a first embodiment. The encoder includes a sensor unit 10A attached to a fixed unit, a scale 20 attached to a movable unit (not illustrated), a signal processor 30, and a storage 40. The relationship between the fixed unit and the movable unit may be reversed, as long as the sensor unit 10A and the scale 20 are configured to move relatively to each other.

The sensor unit 10A is an integrated sensor unit of a light receiving unit and a light emitting unit, and includes a light source 12A including a light emitting diode ("LED") and a light receiving IC 14A including a light receiving element array 16A in the same package. The light receiving element array 16A serves as a detector array that includes a plurality of detectors configured to detect the energy distribution from the pattern of the scale 20 and arranged in an X direction as a moving direction (or a length measuring direction) of the scale 20 (or the movable unit). The energy is light in this embodiment, but as described later, the energy type is not limited to the light and may be include magnetism and electricity. The sensor unit 10A is provided with a weighting unit, as described later. The weighting unit may be provided to the signal processor 30.

The scale 20 has a track 21, which is patterned as a pattern row. The pattern row has a plurality of patterns made of a chromium reflective film on a glass substrate. The pattern is used to spatially modulate the energy distribution.

Each track 21 includes a plurality of areas, which are periodically arranged in a Y direction perpendicular to the X direction and have different pitches (modulation periods) in the X direction. A "pitch" (modulation period), as used herein, means a space period of the patterns formed in a track in the X direction. The pitch (modulation period) is a reciprocal of a spatial frequency (or a value proportioned to the reciprocal). For example, when there are two types of areas, a first area has a first pitch (first modulation period) in the X direction, and a second area has a second pitch (second modulation period) in the X direction.

The light receiving element array 16A in this embodiment receives light reflected on the pattern of the scale 20, but this embodiment is applicable to the light receiving element array 16A configured to receive transmitted light through the pattern of the scale 20. In other words, it is sufficient that the light receiving element array 16A receives the light from the pattern of the scale 20.

The signal processor 30 processes an output signal of the light receiving element array 16A in the sensor unit 10, and converts it into positional information. The signal processor 30 also performs interpolation processing to an encoder signal obtained by the sensor unit 10, and writing and reading of the signal for the storage 40.

The signal processor 30 includes a noise filter (not illustrated), an amplifier (not illustrated), an A/D converter (not illustrated), a signal separator 31, a first phase acquirer 32, a second phase acquirer 33, and a positional information acquirer 34. Depending upon embodiments, the second phase acquirer 33 may be omitted.

The signal separator 31 serves to separate an output from the light receiving element array 16A into a signal corresponding to each area of the track 21A. The signal separator 31 sends a signal used to switch a connection of a switching circuit, if any, in the light receiving IC 14A, or separates the signal using a fast Fourier transform ("FFT") when the light receiving IC 14A has no switching circuit. Alternatively, the signal separator 31 may separate the signal by providing light receiving elements having different light receiving surfaces for each pattern pitch of the light receiving element array 16A.

The first phase acquirer 32 acquires a (first) phase of the energy distribution of the first area by performing an arc tangent operation for an output (digital) signal from the light receiving element array 16A (corresponding to the first area). The first phase acquirer 32 may serve as a relative position signal acquirer, which will be described later. The "relative position," as used herein, means a variation amount of the position or a variation direction or amount of the position per unit time or per sampling period (used to obtain the position signal). Alternatively, the relative position may be a variation direction or amount of the position at reference time (when the power is turned on or at predetermined reference timing).

The second phase acquirer 33 acquires a (second) phase of the energy distribution of the second area by performing an arc tangent operation for an output (digital) signal from the light receiving element array 16A (corresponding to the second area).

When the track 21 contains an area having a third pitch, a third phase acquirer etc. may be provided accordingly.

The positional information acquirer 34 acquires positional information of the scale 20. The positional information acquirer 34 may include a relative position information acquirer configured to acquire a relative position signal representative of a relative position of the scale 20 and an absolute position information acquirer configured to acquire an absolute position signal representative of an absolute position of the scale 20. The "absolute position," as used herein, means a position of a driver to an apparatus that includes the driver, and is different from a variation amount of the position to the position at the predetermined reference timing. Once the absolute position) is determined, the position of the driver to the apparatus is uniquely determined. In the apparatus to which the encoder of this embodiment is attached, a scale is arranged onto one of the driver and the fixed or movable unit that does not move with the driver, and a detector array is arranged onto the other. Thereby, the position of the driver having the scale relative to the fixed unit (apparatus body side) having the detector array becomes detectable.

In operation, a divergent light flux emitted from the light source 12A in the sensor unit 10A is irradiated onto the track 21A of the scale 20, and the light flux reflected on the track 21A is received by the light receiving element array 16A in the sensor unit 10A. The light receiving element array 16A receives an image in which a reflective index distribution of the track 21A is magnified twice. The light flux received by the light receiving element array 16A is converted into an electric signal, and sent as an encoder signal to the signal processor 30. The signal processor 30 converts the output from the light receiving element array 16A into positional information, and precisely obtains and outputs the information of the position of the scale 20.

Figure 2:
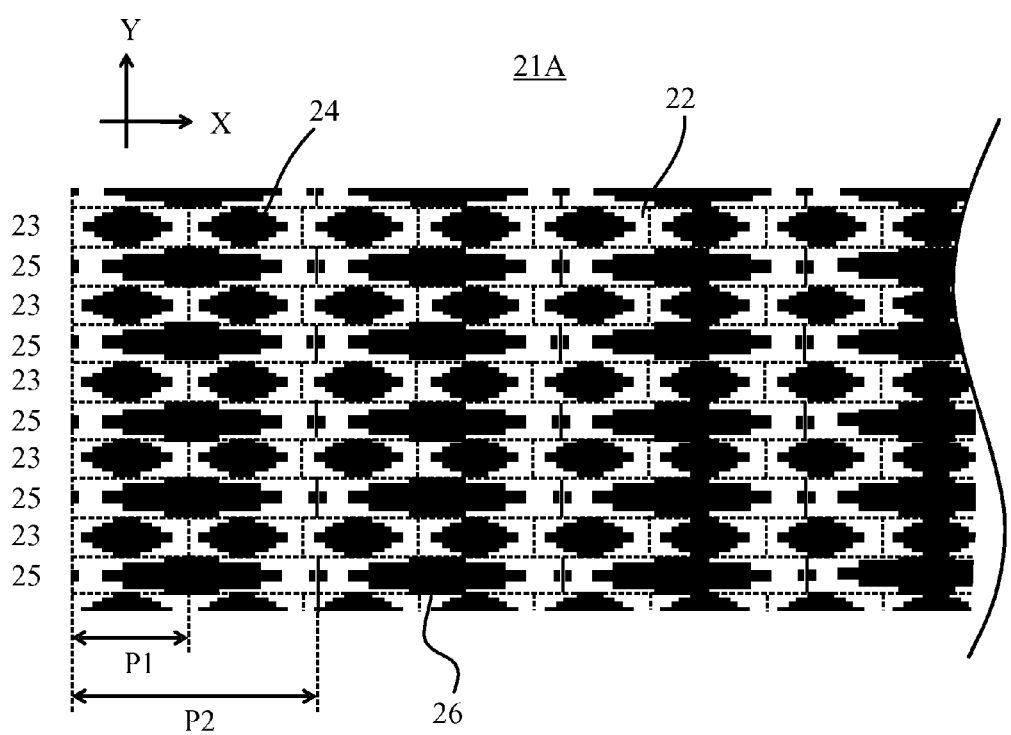
FIG. 2 is a partially enlarged plane view of a track according to the first, second, and third embodiments.

FIG. 2 is a partially enlarged plane view of the track 21A. In the track 21A, two types of areas (23 and 25) alternate in the Y direction perpendicular to the moving direction (X direction) of the scale 20, and one track is set to a range that contains the overall width illustrated in FIG. 2 (that can be scanned on the light receiving surface of the light receiving array 16A). The area 23 corresponds to the above first area, and the area 25 corresponds to the above second area. In FIG. 2, a white portion is a non-reflector 22 configured to transmit or absorb the light.

Figure 3:
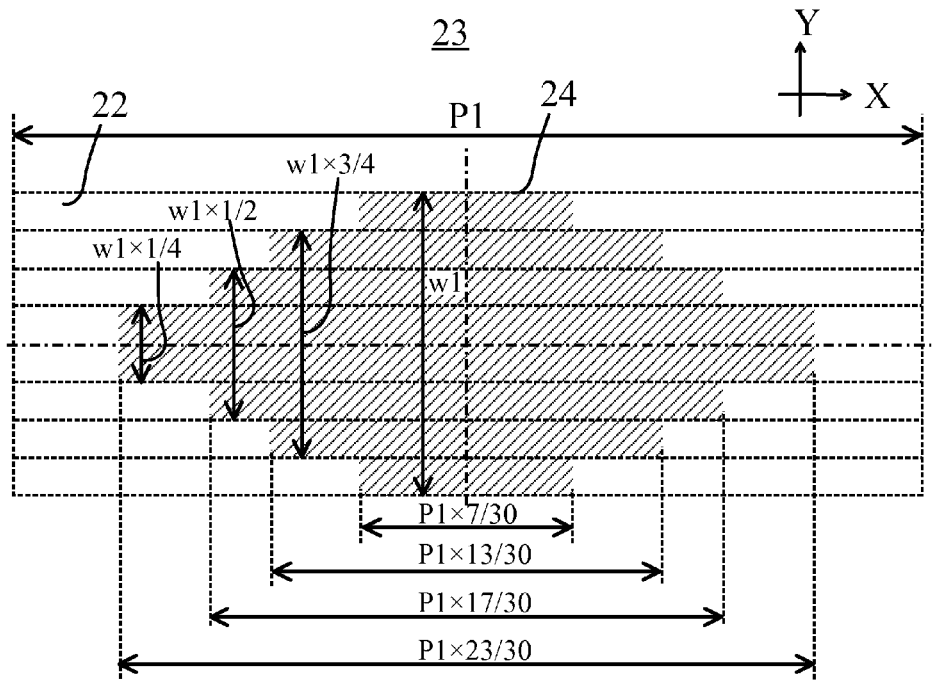
FIG. 3 is a partially enlarged plane view of FIG. 2 according to the first, second, and third embodiments.

FIG. 3 is an enlarged plane view of the area for one period in the X direction. The area 23 includes a pattern row in which the pattern illustrated in FIG. 3 is arranged every (first) pitch P1 (=150 μm) in the X direction. Each pattern includes the non-reflector 22, and a reflector 24 made of a reflective film and configured to reflect light. The pitch P1 serves as the above first modulation period. A width of the area 23 in the Y direction is set to W1=50 μm.

A width of the reflector 24 in the X direction differs according to a position of the area in the Y direction. In an area distant by a distance of w1·⅛ or less from the center in the Y direction, the width of the reflector 24 is P1·23/30 in the X direction. In an area distant by a distance of w1·⅛ to w1·¼ from the center in the Y direction, the width of the reflector 24 is P1·17/30 in the X direction. In an area distant by a distance of w1·¼ to w1·⅜ from the center in the Y direction, the width of the reflector 24 is P1·13/30 in the X direction. In an area distant by a distance of w1·⅜ to w1·½ from the center in the Y direction, the width of the reflector 24 is P1·7/30 in the X direction.

Figure 4:
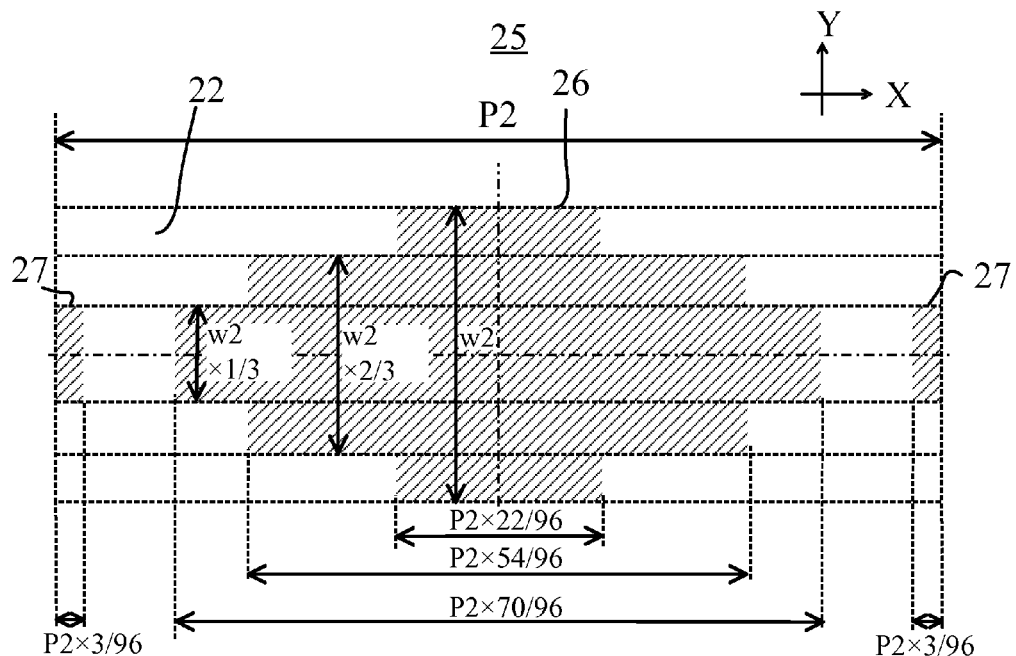
FIG. 4 is a partially enlarged plane view of FIG. 2 according to the first, second, and third embodiments.

FIG. 4 is an enlarged plane view of the area for one period in the X direction. The area 25 includes a pattern row in which the pattern illustrated in FIG. 4 is arranged every (second) pitch P2 (=303 μm) in the X direction. Each pattern includes the non-reflector 22 and reflectors 26, 27 each made of a reflective film and configured to reflect light. The pitch P2 serves as the above second modulation period. A width of the area 25 in the Y direction is set to W2=50 μm.

A width of each of the reflectors 26, 27 in the X direction is different with a position of the area 25 in the Y direction. In an area distant by a distance of w2·⅙ or less from the center in the Y direction, the width of the reflector 26 is P2·70/96 in the X direction. The reflector 27 is formed with a width of P2·3/96 from each of both ends of the period. In an area distant by a distance of w2·⅙ to w2·⅓ from the center in the Y direction, the width of the reflector 26 is P2·54/96 in the X direction. In an area distant by a distance of w2·⅓ to w2·½ from the center in the Y direction, the width of the reflector 26 is P2·22/96 in the X direction.

Figure 5A:
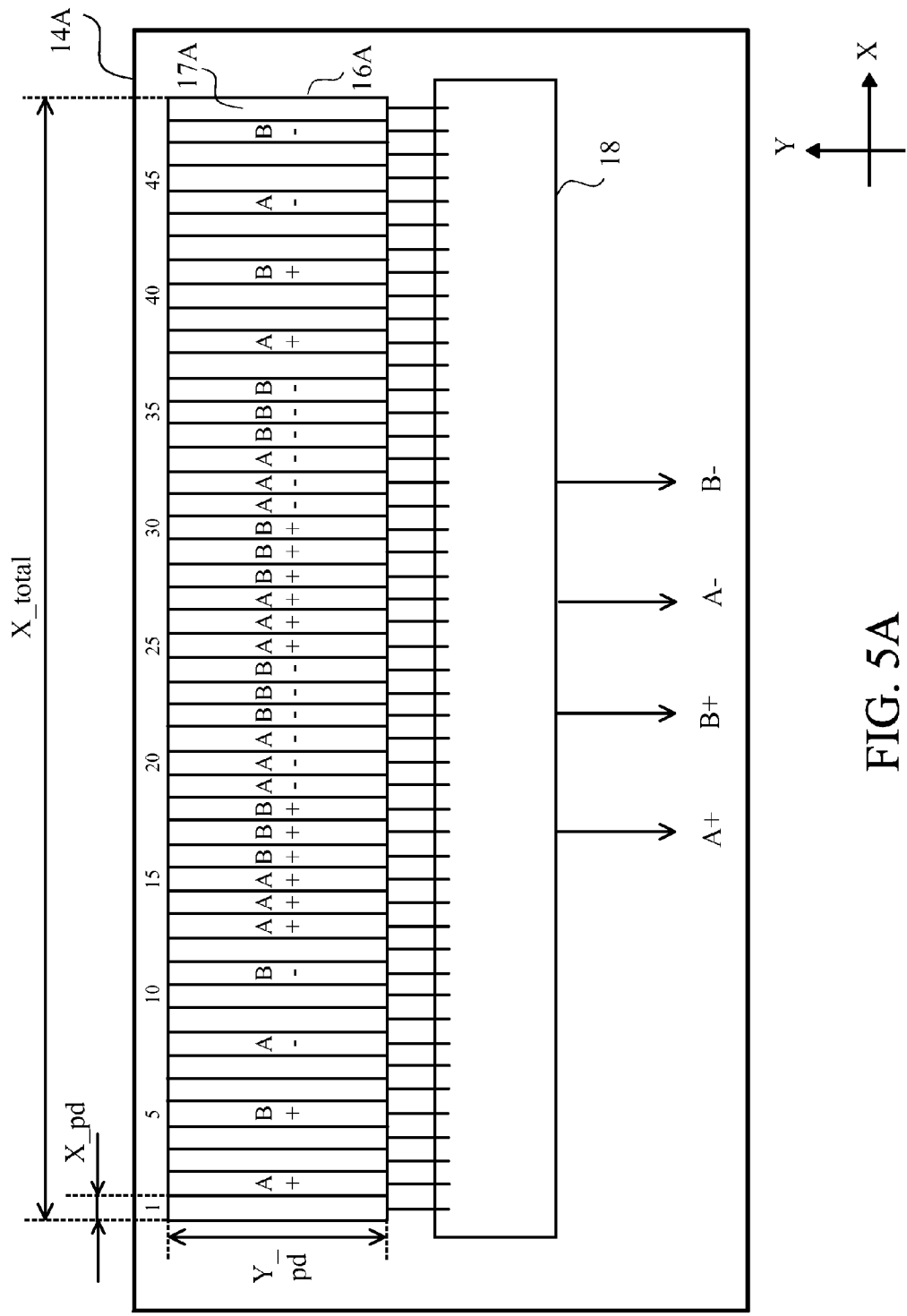
FIGS. 5A and 5B are plane views of a light receiving surface of a light receiving element array illustrated in FIG. 1 according to the first embodiment.
Figure 5B:
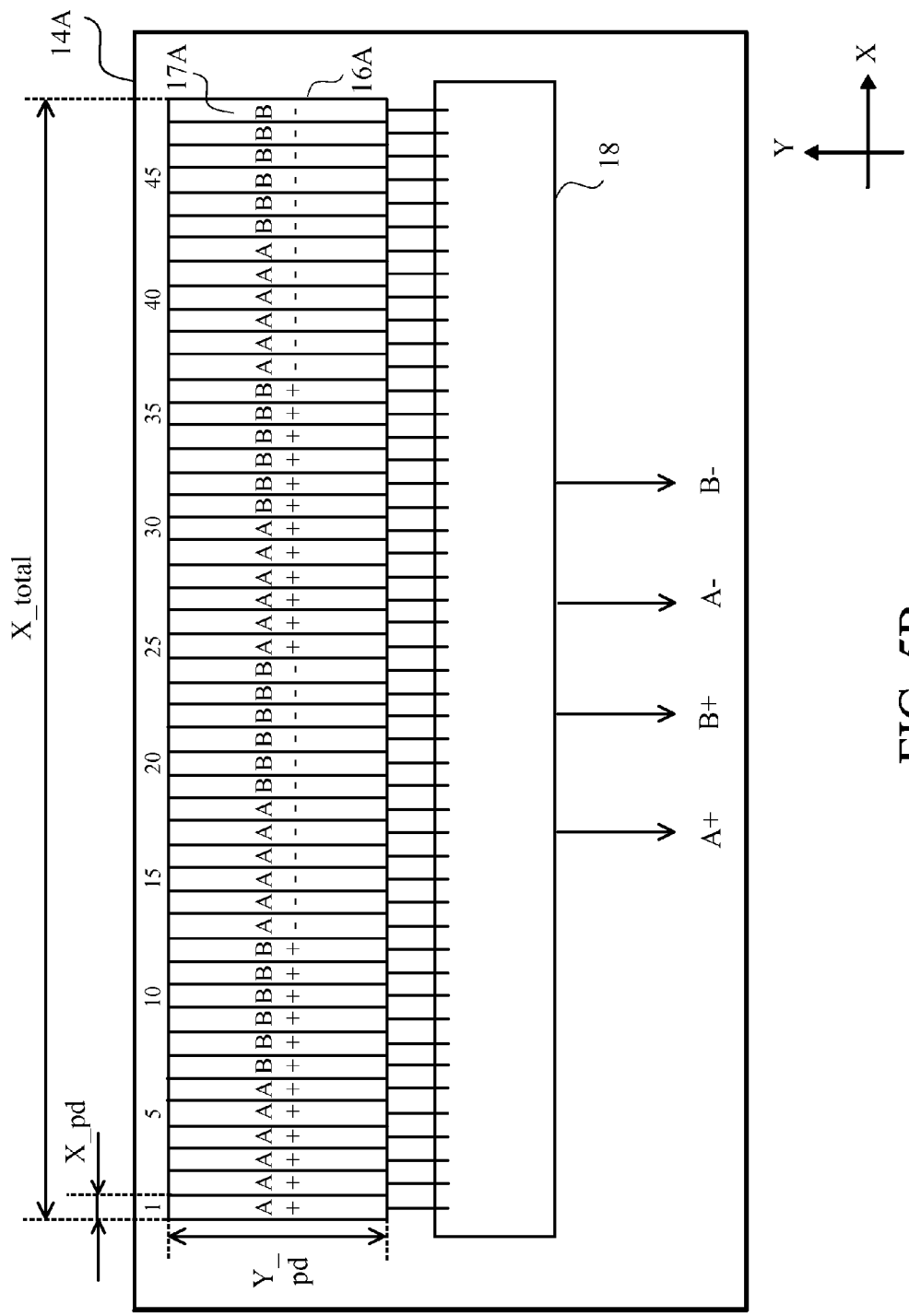

FIGS. 5A and 5B are plane views of the light receiving surface of the light receiving element array 16A. In the light receiving element array 16A, forty-eight light receiving elements 17A are arranged with a pitch of 25 μm in the X direction: One light receiving element 17A has a width X_pd of 25 μm in the X direction, and a width Y_pd of 800 μm in the Y direction. An overall width X_total of the light receiving element array 16A is 1,200 μm.

Since the projected pattern on the scale is magnified twice, the detectable range on the scale is 400 μm in the Y direction and 600 μm in the X direction. Hence, the detectable range on the scale contains four lines in the Y direction, and each line includes, in the position detecting direction, the area 23 with a pitch of 150 μm and the area 25 with a pitch of 303 μm.

An output from each light receiving element 17A is switched by a switching circuit 18, and selectively connected to the four subsequent preamplifiers (not illustrated). Corresponding light receiving elements 17A are connected to output terminals A+, B+, A−, and B− (representative of A+ phase, B+ phase A− phase and B− phase) of four preamplifiers, and the switching circuit 18 is configured to output four-phase sign wave outputs S(A+), S(B+), S(A−), and S(B−).

The switching circuit 18 can switch a connection between the light receiving element 17A and the output terminal on the basis of the input from the signal separator 31 in the signal processor 30. As a result, an electrically added interval is switched in the plurality of light receiving elements 17A.

When the input from the signal processing circuit 30 has a high level, electrically connected light receiving elements 17A can detect a pattern with a pitch of 150 μm (or a reflected image period of 300 μm), as illustrated in FIG. 5A. As a result, the periodic signal from the area 23 can be separated.

When the input from the signal processing circuit 30 has a low level, electrically connected light receiving elements 17A can detect a pattern with a pitch of 300 μm (or a reflected image period of 600 μm), as illustrated in FIG. 5B. As a result, the periodic signal from the area 25 can be separated.

With respect to the detecting pitch, relative phases of the four-phase sine wave signals have the following relationship with S(A+) as a reference: S(B+) shifts by about +90°, S(A−) shifts by about +180° and S(B−) shifts by about +270°.

The signal processor 30 generates two-phase sine wave signals S(A) and S(B) in which a DC component is eliminated, by performing the following operations for the four-phase sine wave outputs S(A+), S(B+), S(A−), and S(B−):

$$S(A)=S(A+)-S(A-) \qquad \text{Expression 1}$$

$$S(B)=S(B+)-S(B-) \qquad \text{Expression 2}$$

At this time, when the input has a low level, S(A+) and S(A−) have the same phase components for the image with a scale pitch of 150 μm, and S(A) is cancelled out as a result of the subtraction of Expression 1. This is true of S(B).

When the input has a high level, as illustrated in FIG. 5A, one of three continuous light receiving elements 17A is configured to take a signal in the twelve left and right light receiving elements 17A among the forty-eight light receiving elements 17A. Hence, weighting of ⅓ is applied to the output signals of the twelve light receiving elements 17A at both sides in comparison with the output signals of the twenty-four light receiving elements 17A at the center.

Thus, this embodiment provides a weighting unit to the sensor unit 10A. The weighting unit is configured to apply a weight corresponding to the position on the light receiving element array or the phase of (second modulation period) P2, to the output signals of the plurality of light receiving elements 17A configured to detect the area 23 as the first area.

As described later, the weight is set so that a weighted value is equal to or smaller than a non-weighted value in a predetermined range that contains the spatial frequency corresponding to P2 of the spatial frequency response.

Figure 6:
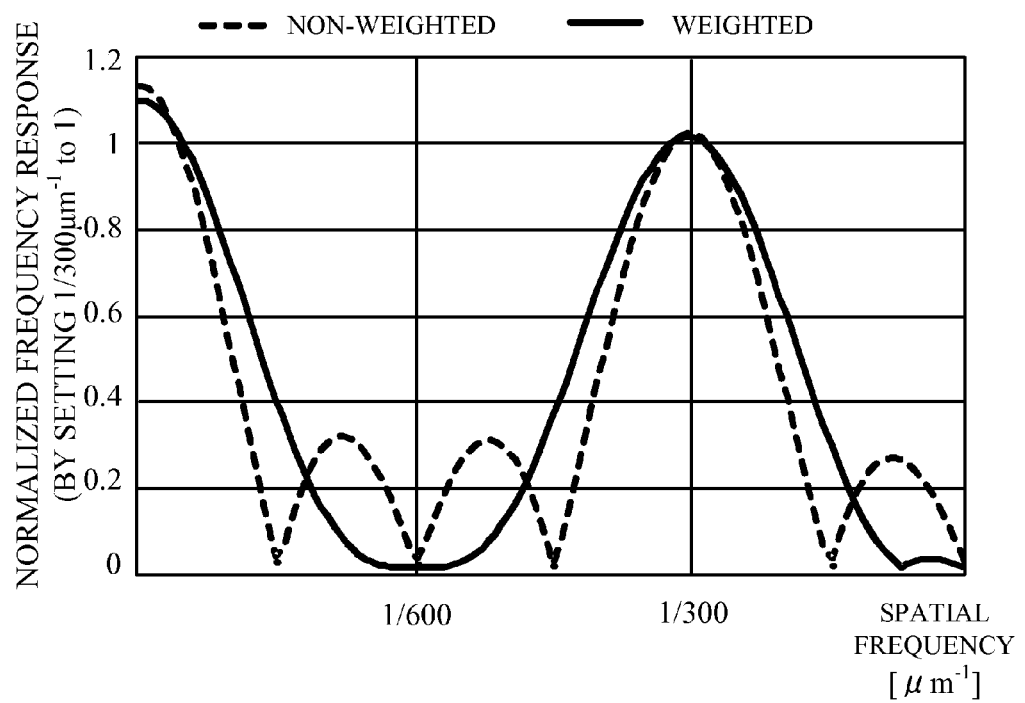
FIG. 6 is a spatial frequency response graph of an A+ phase that compares a non-weighted output signal with a weighted output signal illustrated in FIG. 5A according to the first embodiment.

FIG. 6 is a frequency response graph of an A+ phase that compares a non-weighted output signal with a weighted output signal illustrated in FIG. 5A. The abscissa axis denotes a spatial frequency [μm$^{-1}$] and the ordinate axis denotes a normalized frequency response (by setting 1/300 μm$^{-1}$ to 1). The B+ phase, the A− phase, and the B− phase provide similar spatial frequency responses.

In FIG. 6, a broken line denotes the non-weighted output signals of the plurality of light receiving elements 17A, and a solid line denotes the output signals of the plurality of light receiving elements 17A using a weight in accordance with the phase of P2 (or using a non-uniform weight).

According to the weighting of this embodiment, it is understood that the frequency response reduces near the spatial frequency 1/600 [μm$^1$] corresponding to the pattern frequency of the area 25 in a wide range. Thereby, the four-phase sign wave outputs S(A+), S(B+), S(A−) and S(B−) when the patterns of the area 23 are read out are less affected by the patterns in the area 25, and only a signal corresponding to the patterns in the area 23 can be precisely detected.

Thus, this embodiment can reduce, even when the spatial frequency of the image on the light receiving element fluctuates, a cause of an error of the spatial frequency component of the second pitch P2 on the phase acquisition of the spatial frequency component of the first pitch P1.

The fluctuation of the spatial frequency of the image on the light receiving element is caused, for example, by a mounting height shift between the light source 12A and the light receiving IC 14A, an image magnification error due to a relative inclination between the scale 20 and the light receiving element 17A. Even when the spatial frequencies of the two periodical components on the scale slightly shift from the integer times as in this embodiment, a cause of an error of the spatial frequency component of P2 reduces on the phase acquisition of the spatial frequency component of the first pitch P1. This configuration improves the detecting precision of the relative position signal obtained from the phase of the spatial frequency component of P1, and the detecting precision of the absolute position of the scale 20. In addition, the design freedom improves when a plurality of period data are formed on the scale.

Figure 7:
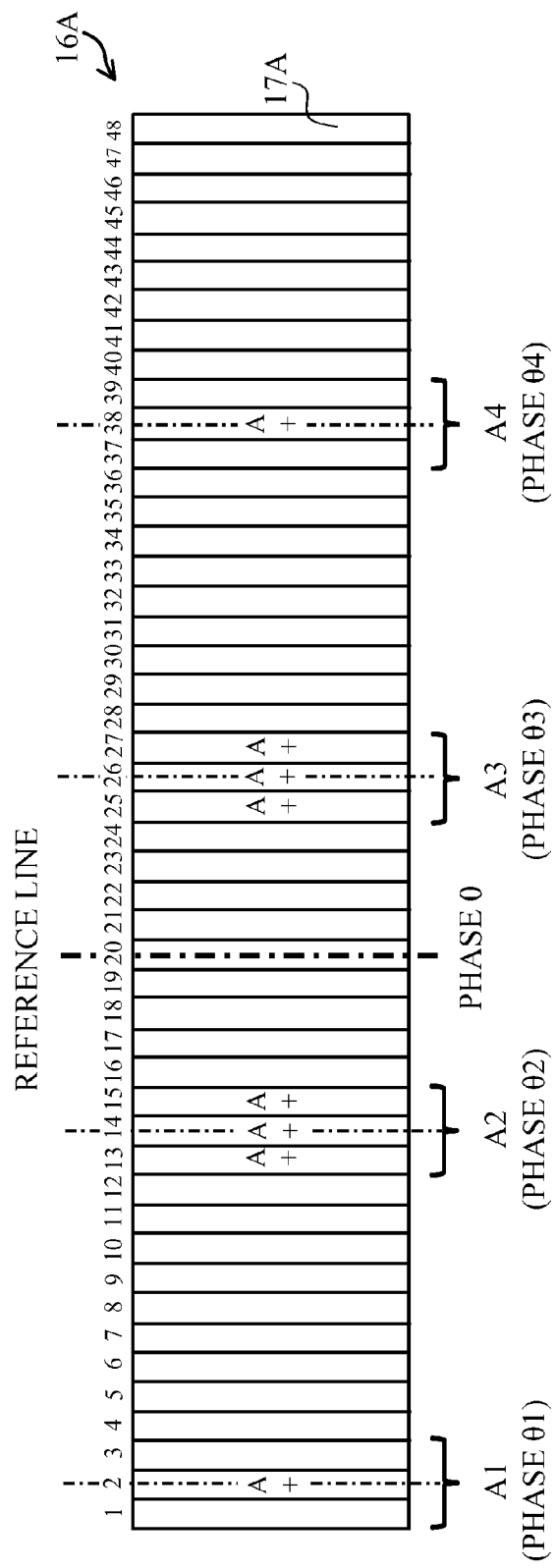
FIG. 7 is a plane view of a light receiving surface of a light receiving element array for explaining a reason of an effect of FIG. 6 according to the first embodiment.

FIG. 7 is a plane view of a light receiving surface of the light receiving element array 16A. Referring now to FIG. 7, a description will be given of a reason why non-uniform weighting in the light receiving area can reduce the frequency response of P2 in a wide area.

Now, address the light receiving element 17A corresponding to the A+ phase, and assume that an image with a period of 600 μm enters the light receiving element array 16A. Now, relative phases θ1 to θ4 of the periodic component of 600 μm are considered for four discrete light receiving element blocks A1 to A4 by setting the center of the light receiving element array 16A corresponding to the A+ phase to the reference line (with a phase of 0°). Then, θ1=−270°, θ2=−90°, θ3=90°, and θ4=+270°. When the detected image has a magnification error Δ (%) from the period of 600 μm, each phase is given as follows:

$$\theta1=-270-270\cdot\Delta\div100=90-270\cdot\Delta\div100 \text{(degrees)} \quad \text{Expression 3}$$

$$\theta2=-90-90\cdot\Delta\div100 \text{(degrees)} \quad \text{Expression 4}$$

$$\theta3=90+90\cdot\Delta\div100 \text{(degrees)} \quad \text{Expression 5}$$

$$\theta4=270+270\cdot\Delta\div100=-90+270\cdot\Delta\div100 \text{(degrees)} \quad \text{Expression 6}$$

For simplicity, assume the following expression:

$$\Delta'=90\cdot\Delta\div100 \quad \text{Expression 7}$$

The outputs S1 to S4 from A1 to A4 can be expressed as follows where a1 to a4 are ratios of the detection efficiencies:

$$S1=a1\cdot\text{SIN}(\theta+90-3\Delta')=a1\cdot\text{COS}\,\theta\cdot\text{COS}(3\Delta')+a1\cdot\text{SIN}\,\theta\cdot\text{SIN}(3\Delta') \quad \text{Expression 8}$$

$$S2=a2\cdot\text{SIN}(\theta-90-\Delta')=-a2\cdot\text{COS}\,\theta\cdot\text{COS}\,\Delta'-a2\cdot\text{SIN}\,\theta\cdot\text{SIN}\,\Delta' \quad \text{Expression 9}$$

$$S3=a3\cdot\text{SIN}(\theta+90+\Delta')=a3\cdot\text{COS}\,\theta\cdot\text{COS}\,\Delta'-a3\cdot\text{SIN}\,\theta\cdot\text{SIN}\,\Delta' \quad \text{Expression 10}$$

$$S4=a4\cdot\text{SIN}(\theta-90+3\Delta')=-a4\cdot\text{COS}\,\theta\cdot\text{COS}(3\Delta')+a4\cdot\text{SIN}\,\theta\cdot\text{SIN}(3\Delta') \quad \text{Expression 11}$$

The total output is expressed as follows by using approximations of SIN Δ'≈Δ', SIN(3Δ')≈3Δ', COS(3Δ')≈COS Δ'≈1 because of Δ'<<360:

$$S1+S2+S3+S4\approx\text{COS}\,\theta\cdot(a1-a2+a3-a4)+\text{SIN}\,\theta\cdot(a1\cdot3\Delta'-a2\cdot\Delta'-a3\cdot\Delta'+a4\cdot3\Delta') \quad \text{Expression 12}$$

Hence, even when the magnification error Δ fluctuates, the condition S1+S2+S3+S4≈0 can be established when a1+a3=a2+a4 and 3·(a1+a4)=a2+a3 are satisfied. One conceivable solution is, for example, a1:a2:a3:a4=1:4:5:2. However, symmetrical weighting in the X direction, such as a1:a2:a3:a4=1:3:3:1, is simpler and easier for designs, and likely to reduce the influence of asymmetrical light amount distribution.

Actual designs do not need this weighting ratio, and may use proper weighting depending upon the light amount distribution incident upon the light receiving element and the necessary and sufficient precision. This is true of the B+ phase, the A− phase, and the B− phase.

Turning back to FIGS. 5A-5B, a correction of a signal obtained from the area 25 will be described when the input to the switching circuit 18 has a low level. Since the detecting pitch (of 300 μm) of the light receiving element 17A slightly differs from the patterned period (of 303 μm) of the scale, a relative phase difference may be corrected between the two-phase sine wave signals S(A) and S(B). A description will now be given of a method of correcting the phase difference.

The two-phase sine wave signals S(A) and S(B) including the relative phase difference error "e" are expressed with a phase of θ as follows:

$$S(A)=\cos(\theta+e/2) \quad \text{Expression 13}$$

$$S(B)=\sin(\theta-e/2) \quad \text{Expression 14}$$

Using Expressions 13 and 14, an error component "e" can be separated by an addition and a subtraction between the two-phase sine wave signals S(A) and S(B) as follows:

$$S(A)+S(B)=2\cdot\cos(\theta-\pi/4)\sin(e/2-\pi/4) \quad \text{Expression 15}$$

$$-S(A)+S(B)=2\cdot\sin(\theta-\pi/4)\cos(e/2-\pi/4) \quad \text{Expression 16}$$

The relative phase difference error "e" can be expressed as e=(1−300/303)·π using the set values. By multiplying both sides of Expression 15 by the reciprocal of 2·sin(e(x)/2−π/4) and by multiplying both sides of Expression 16 by the reciprocal of 2·cos(e(x)/2−π/4) two-phase sine wave signals S(A)' and S(B)' are calculated as follows in which the phase difference error is corrected where ϕ=θ−π/4:

$$S(A)'=(S(A)+S(B))/(2\cdot\sin(e/2-\pi/4))=\cos\phi \quad \text{Expression 17}$$

$$S(B)'=(-S(A)+S(B))/(2\cdot\cos(e/2-\pi/4))=\sin\phi \quad \text{Expression 18}$$

The relative phase difference error "e" may be stored through the initialization. For example, the amplitude component 2·sin(e(x)/2−π/4) is obtained from (maximum value−minimum value)/2 of S(A)+S(B) in the predetermined range in the X direction, and the amplitude component 2·cos(e(x)/2−π/4) is obtained from (maximum value−minimum value)/2 of −S(A)+S(B) in the predetermined range in the X direction. These values may be stored in the storage 40. In this case, it is possible to correct mounting height shifts between the light source 12A and the light receiving element array 16A and the relative inclination between the scale 20 and the sensor.

Thus obtained S(A)' is set to S(A) and S(B)' is set to S(B).

The first phase acquirer 32 in the signal processor 30 acquires a phase (signal) Φ1 of the energy distribution for the area 23 using the following operation and S(A) and S(B) when the input to the switching circuit 18 has a high level. ATAN 2[Y, X] is an arc tangent function that determines a quadrant and converts it into a phase between 0 and 2π.

$$\Phi1=\text{ATAN}\,2[S(A),S(B)] \quad \text{Expression 19}$$

Similarly, the second phase acquirer 33 in the signal processor 30 acquires a phase (signal) Φ2 of the energy distribution for the area 25 using the following operation and S(A) and S(B) when the input to the switching circuit 18 has a low level.

$$\Phi 2 = ATAN\ 2[S(A), S(B)] \quad \text{Expression 20}$$

The position signal acquirer of this embodiment acquires the output of the first phase acquirer 32 as the relative position signal. Information of which period the scale 20 is located at from the measurement starting position when the period is predetermined can be obtained, by counting a change of the relative position signal.

The position signal acquirer of this embodiment generates a Vernier signal, which will be described later, based on the outputs of the first phase acquirer 32 and the second phase acquirer 33, and outputs information of the absolute position of the scale 20.

Signals $\Phi 1$ and $\Phi 2$ can be obtained at almost the same position without a time difference before and after switching of the input into the switching circuit 18.

In this embodiment, as illustrated in FIGS. 5A-5B, at least part of a plurality of light receiving elements 17A in the light receiving element array 16A are commonly used as the light receiving element 17A to obtain the phase signal $\Phi 1$ and the light receiving element 17A to obtain the phase signal $\Phi 2$. Hence, the light receiving element array can be made smaller than the conventional structure that separately includes the light receiving element 17A used to obtain the phase signal $\Phi 1$ and the light receiving element 17A used to obtain the phase signal $\Phi 2$.

The synchronism is likely to decrease when the scale 20 quickly moves, but can be maintained by obtaining a plurality of phases and by averaging the phases. Initially, S(A+), S(A−), S(B+) and S(B−) are obtained with a detecting pitch of 150 μm, and the level of the input into the switching circuit 18 is switched from the high level to the low level. Next, S(A+), S(A−), S(B+) and S(B−) are obtained with a detecting pitch of 300 μm, the level of the input into the switching circuit 18 is switched from the low level to the high level, and S(A+), S(A−), S(B+) and S(B−) are again obtained with a detecting pitch of 150 μm. An interval of the acquisition timing is maintained approximately constant. The synchronism between $\Phi 1$ and $\Phi 2$ can be improved by averaging the first $\Phi 1$ and the second $\Phi 1$ obtained through the above operations.

Next, the positional information acquirer 34 in the signal processor 30 acquires the Vernier signal Sv that serves as the absolute position signal as follows:

$$Sv = \Phi 1 - 2 \cdot \Phi 2 \quad \text{Expression 21}$$

At this time, the signal processor 30 repeats $Sv = Sv + 2\pi$ when $Sv < 0$ and $Sv = Sv - 2\pi$ when $Sv > 2\pi$ and converts Sv into an output range between 0 and $2\pi$. The relationship between the phase signal $\Phi 1$ for P1 and the position x in the X direction and the relationship between the phase signal $\Phi 2$ for P2 and the position x in the X direction are expressed as follows:

$$\Phi 1 = 2\pi \cdot x / P1 \quad \text{Expression 22}$$

$$\Phi 2 = 2\pi \cdot x / P1 \quad \text{Expression 23}$$

The coefficients of Vernier signal Sv are not limited to those in Expression 21. The Vernier signal Sv can be expressed as $Sv = A \cdot \Phi 1 - B \cdot \Phi 2$ where A and B are coefficients that satisfy A/B = n/m using the first modulation period P1 and the second modulation period P2 and integers m and n that satisfy $|(m \cdot P1 - n \cdot P2)| < |(P1 - P2)|$.

The period Tv of the Vernier signal Sv is a phase variance amount of $\Phi 1 - 2 \cdot \Phi 2$ from 0 to $\pm 2\pi$ in the X direction, and thus Sv can be expressed as follows:

$$\Phi 1 - 2 \cdot \Phi 2 = 2\pi \cdot Tv/P1 - 2 \cdot 2\pi \cdot Tv/P2 = \pm 2\pi \quad \text{Expression 24}$$

$$Tv = |P1 \cdot P2/(2 \cdot P1 - P2)| \quad \text{Expression 25}$$

Figure 8A:
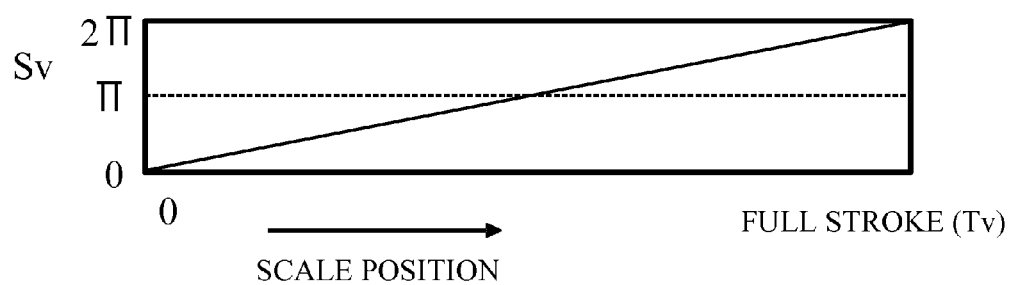
FIGS. 8A and 8B illustrate a relationship between a detection signal and a scale position according to the first embodiment.

FIG. 8A illustrates a relationship between the thus obtained Vernier signal Sv and the scale position. In this embodiment, the period Tv of the Vernier signal Sv becomes 15.15 mm from Expression 25, and this is a detectable range. Since the detectable range on the scale in the light receiving element array length is a range of 600 μm in the X direction, the detectable range is much longer than a detectable range of the light receiving element array length. Thus, by using the Vernier signal as an absolute position signal, the absolute position of the scale in the moving direction can be detected in a wide range.

Figure 8B:
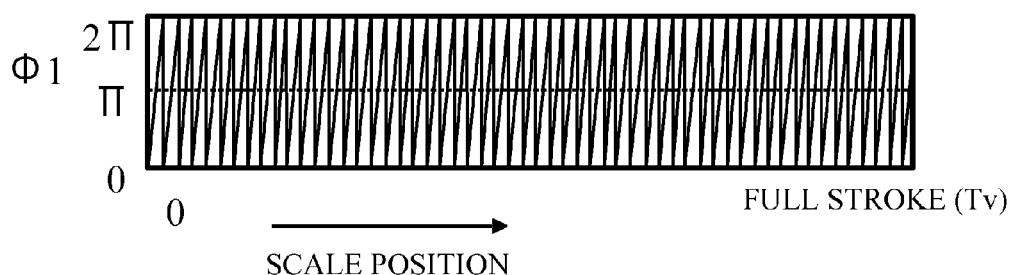

FIG. 8B illustrates a relationship between the phase output $\Phi 1$ and the scale position. The phase $\Phi 1$ is used for the relative position signal (incremental signal) representative of the relative position of the scale 20, and the Vernier signal Sv is used as an absolute position signal representative of the absolute position of the scale 20.

While this embodiment illustrates an optical encoder, a magnetic encoder and an electrostatic encoder can also exhibit similar effects. In case of the magnetic encoder, a magnetic material is utilized for the scale 20, and a magnetic polarity distribution is formed with a shape similar to the reflective film of the scale 20 of this embodiment. A magnetic field detector array is arranged closely to this scale for detections. In the electrostatic type, a conductive electrode pattern is formed in a shape similar to the scale reflective film of this embodiment, and another electrode pattern array is closely opposed for detections.

Thus, an absolute position signal can be precisely obtained in a wide range without increasing the size of the sensor.

Second Embodiment

Figure 9:
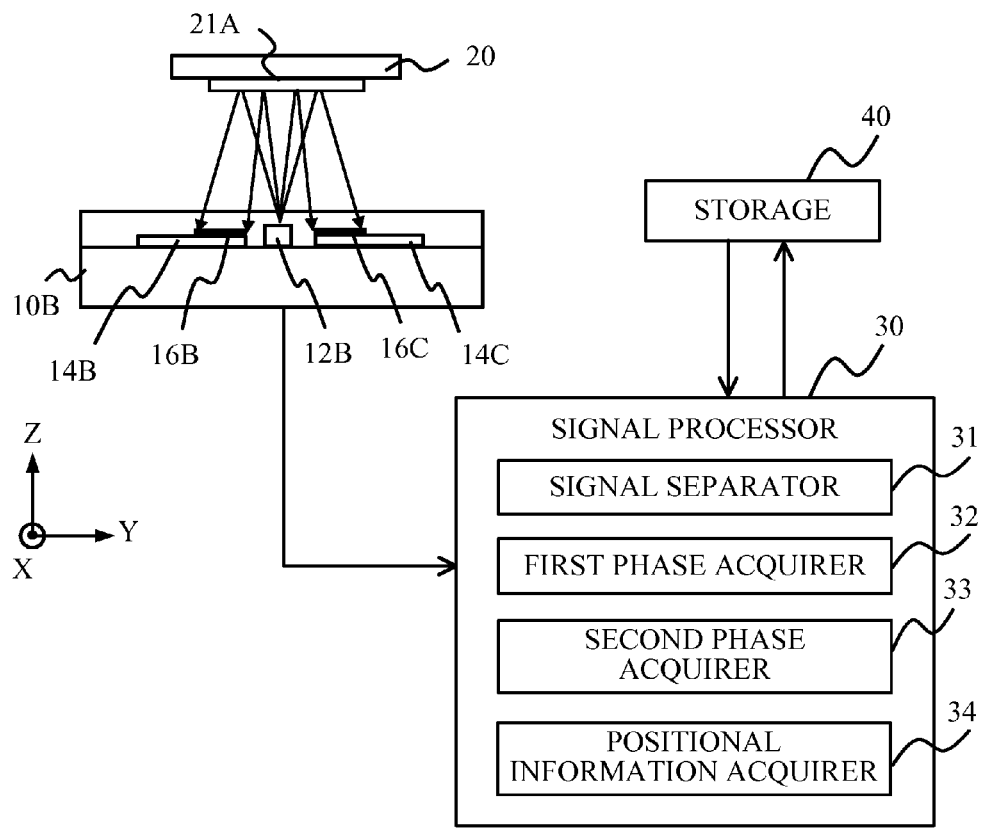
FIG. 9 is a block diagram of an encoder according to the second and third embodiments.

FIG. 9 is a block diagram of an optical encoder according to a second embodiment. The encoder includes a sensor unit 10B attached to a fixed unit, the scale 20 attached to a movable unit (not illustrated), the signal processor 30, and the storage 40. The relationship between the fixed unit and the movable unit may be reversed, as long as the sensor unit 10B and the scale 20 are configured to move relatively to each other.

The sensor unit 10B is an integrated sensor unit of a light receiving unit and a light emitting unit, and includes a light source 12B including one LED a light receiving IC 14B including a light receiving element array 16B, and a light receiving IC 14C including a light receiving element array 16C in the same package. Each of the light receiving element arrays 16B, 16C serves as a detector array that includes a plurality of detectors configured to detect the energy distribution from the pattern of the scale 20 and arranged in an X direction as a moving direction (or a length measuring direction).

The signal processor 30 is similar to that of the first embodiment, but is configured to convert the output from each of the light receiving element arrays 16B and 16C, into positional information.

Figure 10:
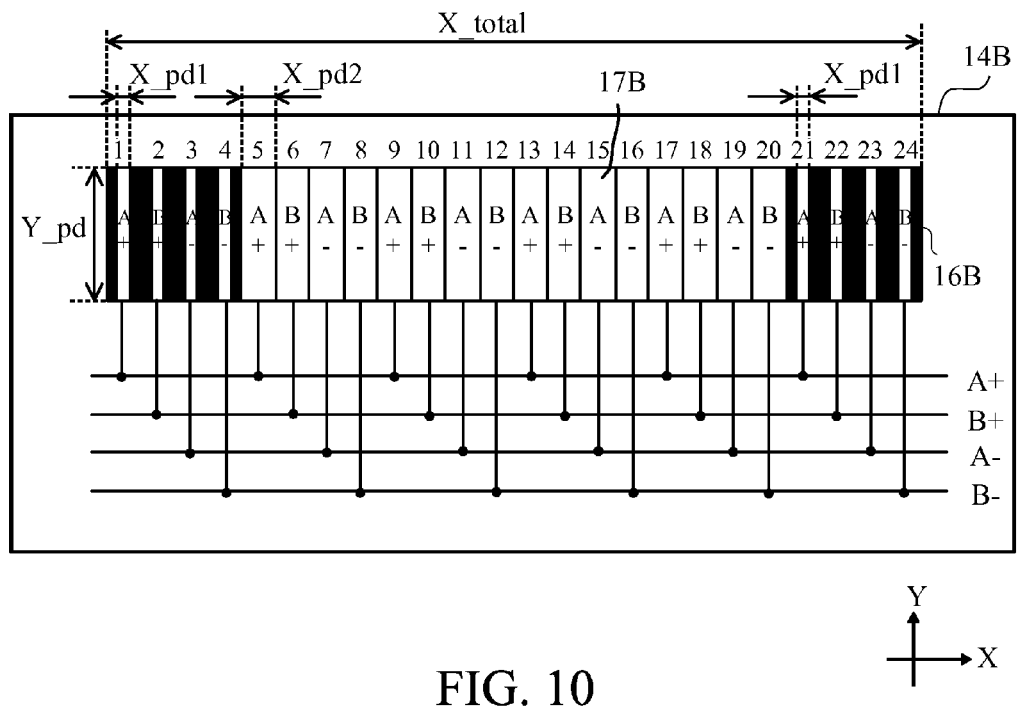
FIG. 10 is a plane view of a light receiving surface of a light receiving element array illustrated in FIG. 9 according to the second embodiment.

FIG. 10 is a plane view of a light receiving surface of the light receiving IC 14B. In the light receiving IC 14B, twenty-four light receiving elements 17B are arranged with a pitch of 75 μm in the X direction: One light receiving element 17B has a width X_pd of 75 μm in the X direction, and a width Y_pd of 800 μm in the Y direction. An overall width X_total of the light receiving element array 14B is 1,800 μm.

Since the projected pattern on the scale is magnified twice, the detectable range on the scale is 400 μm in the Y direction and 900 μm in the X direction. Hence, the detectable range on the scale contains four lines in the Y direction, and each line includes the area 23 with a pitch of 150 μm in the position detecting direction and the area 25 with a pitch of 303 μm.

The width in the X direction of the light receiving element 17B differs according to areas. The width X_pd1 is 30 μm in the X direction of the first to fourth light receiving elements 17B from the left end in FIG. 10. The width X_pd2 of the fifth to twentieth light receiving elements 17B is 75 μm in the X direction. The width X_pd1 of the twenty-first to twenty-fourth light receiving elements 17B is 30 μm in the X direction in FIG. 10.

Thus, the sensor unit 10B of this embodiment is provided with a weighting unit. The weighting unit is configured to apply a weight corresponding to the position on the light receiving element array or the phase of (second modulation period) P2, to the output signals of the plurality of light receiving elements 17A configured to detect the area 23.

Figure 11:
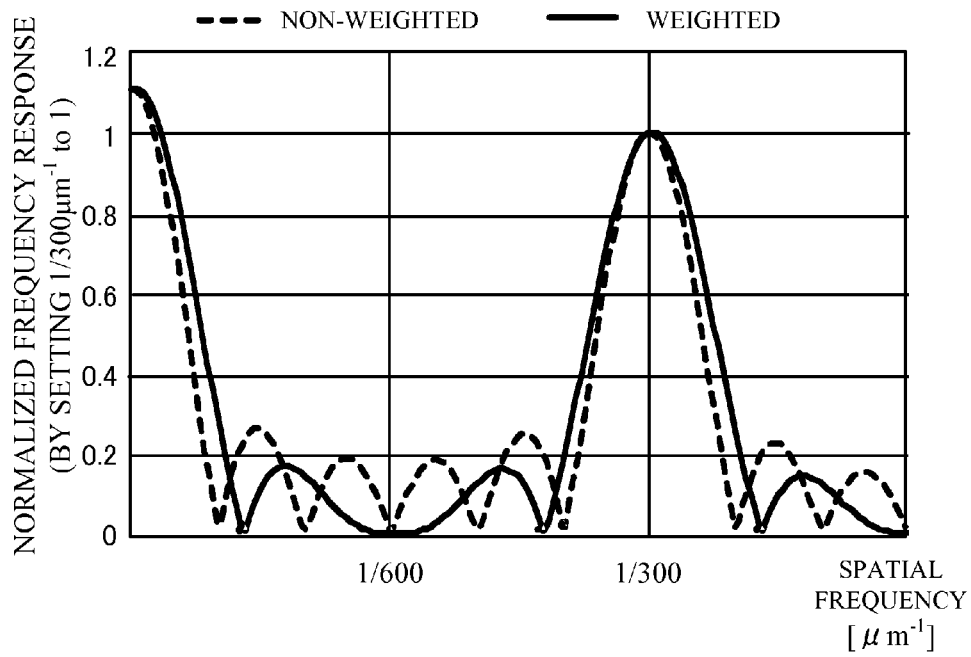
FIG. 11 is a spatial frequency response graph of an A+ phase that compares a non-weighted output signal with a weighted output signal illustrated in FIG. 10 according to the second embodiment.

FIG. 11 is a spatial frequency response graph of an A+ phase that compares a non-weighted output signal with a weighted output signal illustrated in FIG. 10. The abscissa axis denotes a spatial frequency [μm$^{-1}$] and the ordinate axis denotes a normalized frequency response (by setting $\frac{1}{300}$ μm$^{-1}$ to 1). The B+ phase, the A− phase, and the B− phase provide similar spatial frequency responses.

In FIG. 11, a broken line denotes the non-weighted output signals of the plurality of light receiving elements 17B and a solid line denotes the output signals of the plurality of light receiving elements 17B weighted using a weight in accordance with the phase of P2.

According to the weighting of this embodiment, it is understood that the frequency response reduces near the spatial frequency $\frac{1}{600}$ [μm$^{-1}$] corresponding to the pattern frequency of the area 25 in a wide range. In other words, a leakage of an unnecessary component to the magnification error (which is a twice magnified image component of a pattern of 303 μm) can reduce in a wide frequency range by performing non-uniform weighting in the light receiving area. Thereby, the four-phase sign wave outputs S(A+), S(B+), S(A−) and S(B−) are less affected by the patterns of the area 25 when the patterns of the area 23 are read out, and only a signal corresponding to the patterns of the area 23 can be precisely detected.

Thus, this embodiment can reduce, even when the spatial frequency of the image on the light receiving element fluctuates, a cause of an error of the spatial frequency component of P2 on the phase acquisition of the spatial frequency component of P1.

Figure 12:
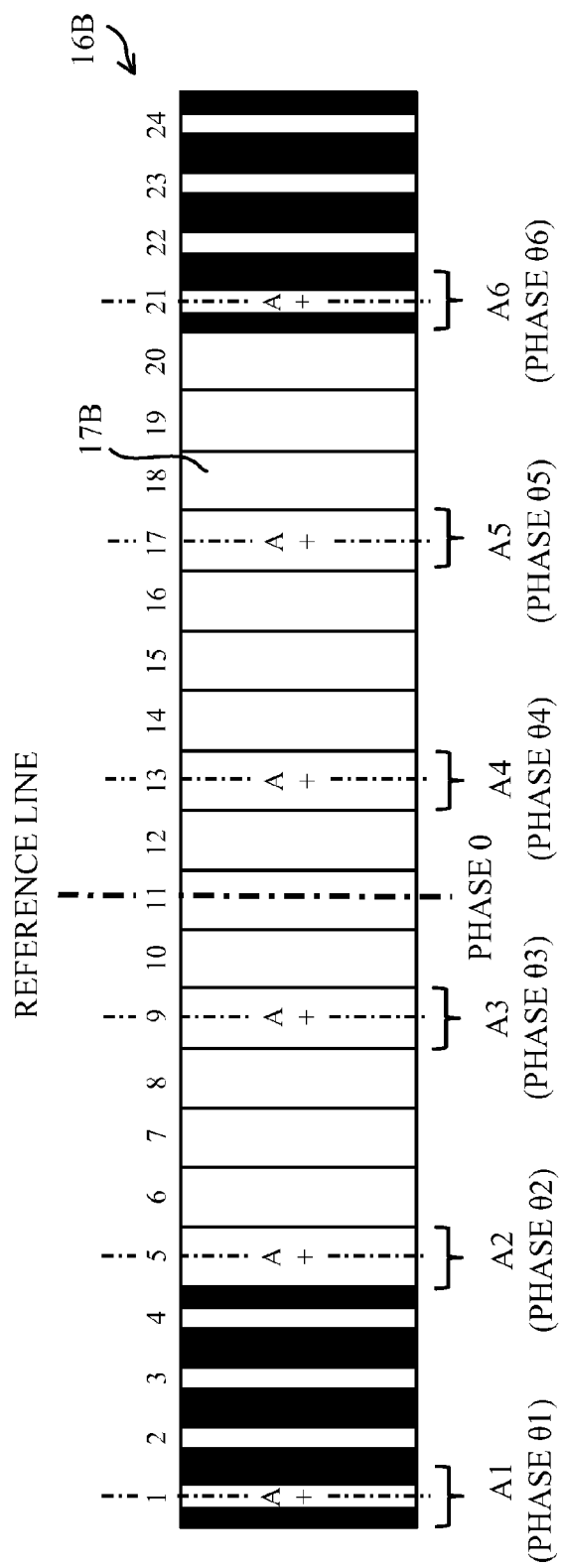
FIG. 12 is a plane view of a light receiving surface of a light receiving element array for explaining a reason of an effect of FIG. 11 according to the second embodiment.

FIG. 12 is a plane view of a light receiving surface of the light receiving element array 16B. Referring now to FIG. 12, a description will be given of a reason why non-uniform weighting in the light receiving area can reduce the frequency response of P2 in a wide area.

Now, address the light receiving element 17B corresponding to the A+ phase, and assume relative phases θ1 to θ6 of the periodic component of 600 μm for six discrete light receiving element blocks A1 to A6. When the detected image has a magnification error Δ (%) from the period of 600 μm, each phase is given as follows:

$$\theta1=-450-450\cdot\Delta\div100=-90-450\cdot\Delta\div100\text{(degrees)} \quad \text{Expression 26}$$

$$\theta2=-270-270\cdot\Delta\div100=90-270\cdot\Delta\div100\text{(degrees)} \quad \text{Expression 27}$$

$$\theta3=-90-90\cdot\Delta\div100\text{(degrees)} \quad \text{Expression 28}$$

$$\theta4=-90+90\cdot\Delta\div100\text{(degrees)} \quad \text{Expression 29}$$

$$\theta5=270+270\cdot\Delta\div100=-90+270\cdot\Delta\div100\text{(degrees)} \quad \text{Expression 30}$$

$$\theta6=450+450\cdot\Delta\div100=90+450\cdot\Delta\div100\text{(degrees)} \quad \text{Expression 31}$$

Similar to the first embodiment, the total output is expressed as follows by using approximations of Δ'=90·Δ÷100, SIN Δ'≈Δ', SIN(3Δ')≈3Δ', and COS(3Δ')≈COS Δ'≈1:

$$S1+S2+S3+S4+S5+S6\approx\text{COS }\theta\cdot(-a1+a2-a3+a4-a5+a6)+\text{SIN }\theta\cdot(-a1\cdot5\Delta'+a2\cdot3\Delta'-a3\cdot\Delta'-a4\cdot\Delta'+a5\cdot3\Delta'-a6\cdot5\Delta') \quad \text{Expression 32}$$

Hence, even when the magnification error Δ fluctuates, the condition S1+S2+S3+S4+S5+S6≈0 is met when a1+a3+a5=a2+a4+a6 and 3·(a2+a5)=(a3+a4)+5·(a1+a6) are established. This embodiment sets a1:a2:a3:a4:a5:a6=0.4:1:1:1:1:0.4.

Figure 13:
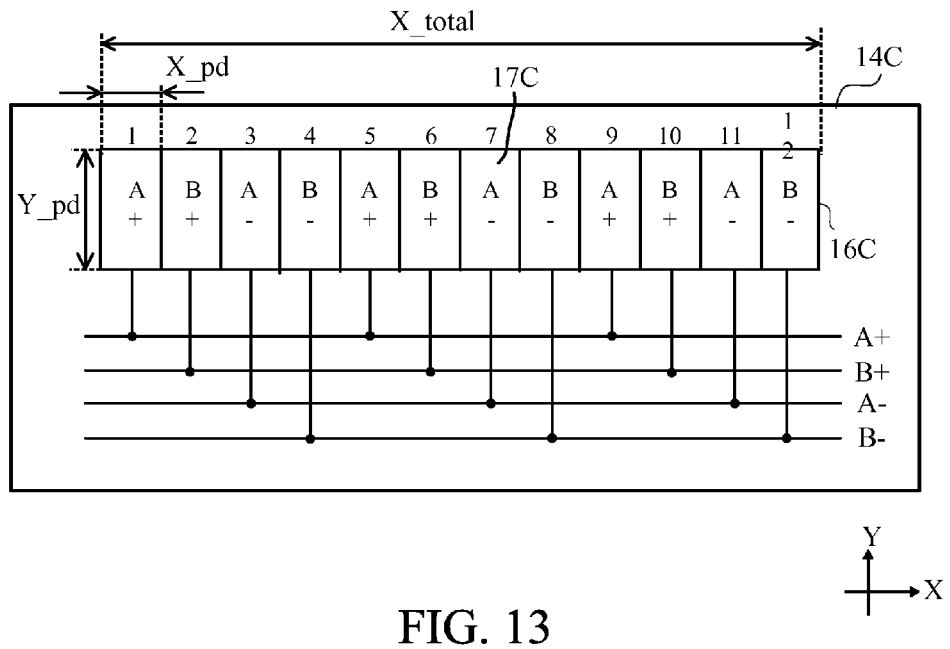
FIG. 13 is a plane view of a light receiving surface of a light receiving element array illustrated in FIG. 9 according to the second and third embodiments.

FIG. 13 is a plane view of a light receiving surface of the light receiving element array 16C. In the light receiving element array 14C, twelve light receiving elements 17C are arranged with a pitch of 150 μm in the X direction: One light receiving element 17C has a width X_pd of 150 μm in the X direction, and a width Y_pd of 800 μm in the Y direction. An overall width X_total of the light receiving element array 16C is 1,800 μm.

Since the projected pattern on the scale is magnified twice, the detectable range on the scale is 400 μm in the Y direction and 900 μm in the X direction. Hence, the detectable range on the scale contains four lines in the Y direction, and each line includes the area 23 with a pitch of 150 μm in the position detecting direction and the area 25 with a pitch of 303 μm.

The arrangement of the light receiving surface 17C corresponds to the detecting pitch of the period of 300 μm of the scale pattern (or a reflected image period of 600 μm). At this time, S(A+) and S(A−) have the same phase components for the image of the area 23 (a reflected image period of 300 μm), and S(A) is cancelled out as a result of the above subtraction. This is true of S(B).

Figure 14:
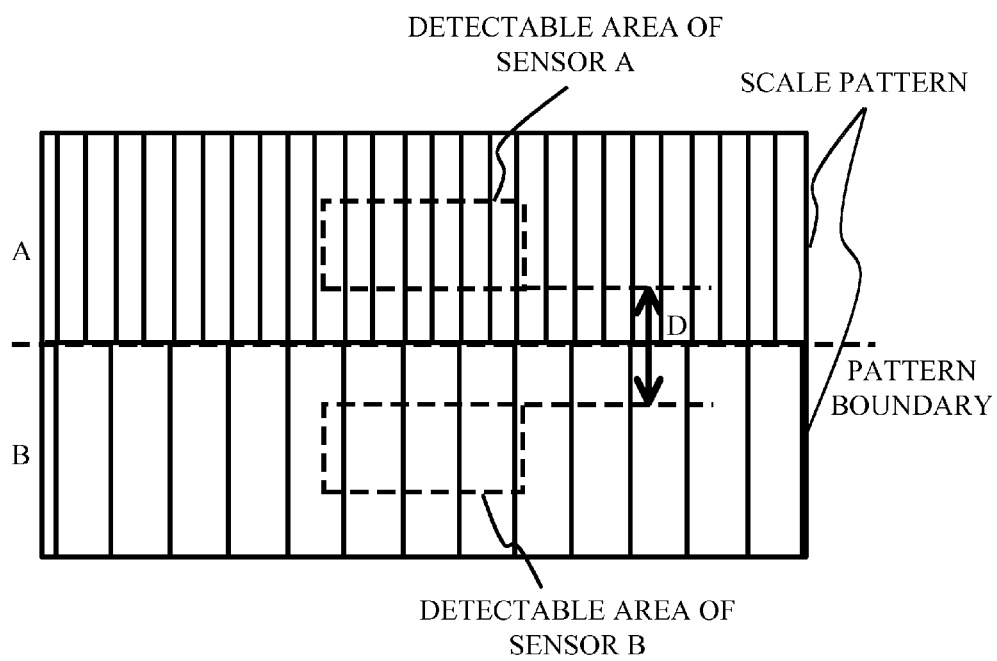
FIG. 14 illustrates a positional relationship between a patterned area and a reading area of a two-track detector according to the second embodiment.

A description will now be given of an advantage in simultaneous receiving of images from different periodic patterns for each light receiving element array. FIG. 14 illustrates a reading area of each sensor and a position shiftable range in the Y direction when the light receiving element A (first detector) and the light receiving element B (second detector) scan separate periodic patterns.

In order to prevent the sensor reading area from projecting from the corresponding pattern, it is necessary to precisely set the relative position in the Y direction because the position shiftable range is limited to ±D/2 by the interval D of the reading area.

On the other hand, as in this embodiment, when images are simultaneously received from different periodic patterns and only a necessary signal is detectably separated, the above limitation is not applied and a signal can be stably and precisely obtained.

As described above, this embodiment detects a different period with a separate light receiving element and thus requires no switching processing. Therefore, this embodiment is more effective than the first embodiment in a system that emphasizes the time synchronism between periodic signals.

Third Embodiment

This embodiment is similar to the second embodiment except for using the light receiving IC 14D by changing an arrangement of the light receiving surface of the light receiving ID 14B. Even when the magnification error Δ fluctuates, the condition S1+S2+S3+S4+S5+S6≈0 is satisfied when a1+a3+a5=a2+a4+a6 and 3·(a2+a5)=(a3+a4)+5·(a1+a6) are established. This embodiment sets a1:a2:a3:a4:a5:a6=1:2:1:1:2:1. Thus, similar to the second embodiment, this embodiment includes a weighting unit in the sensor unit 10B.

Figure 15:
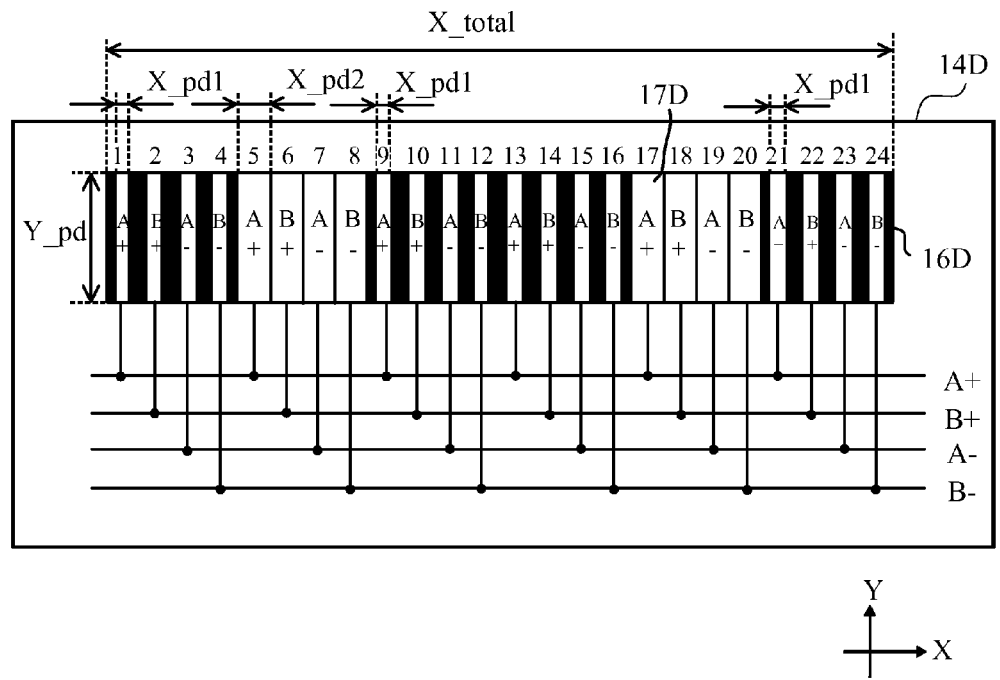
FIG. 15 is a plane view of a light receiving surface of a light receiving element array illustrated in FIG. 9 according to the third embodiment.

FIG. 15 is a plane view that illustrates an arrangement of a light receiving surface of the light receiving element array 14D. The width of each light receiving element differs in the X direction according to areas. The width X_pd1 is 32.5 µm in the X direction of the first to fourth, ninth to sixteenth, twenty-first to twenty-fourth light receiving elements 17D from the left end in FIG. 15. The width X_pd2 is 75 µm in the X direction of the fifth to eighth and seventeenth to twentieth light receiving elements 17D.

Figure 16:
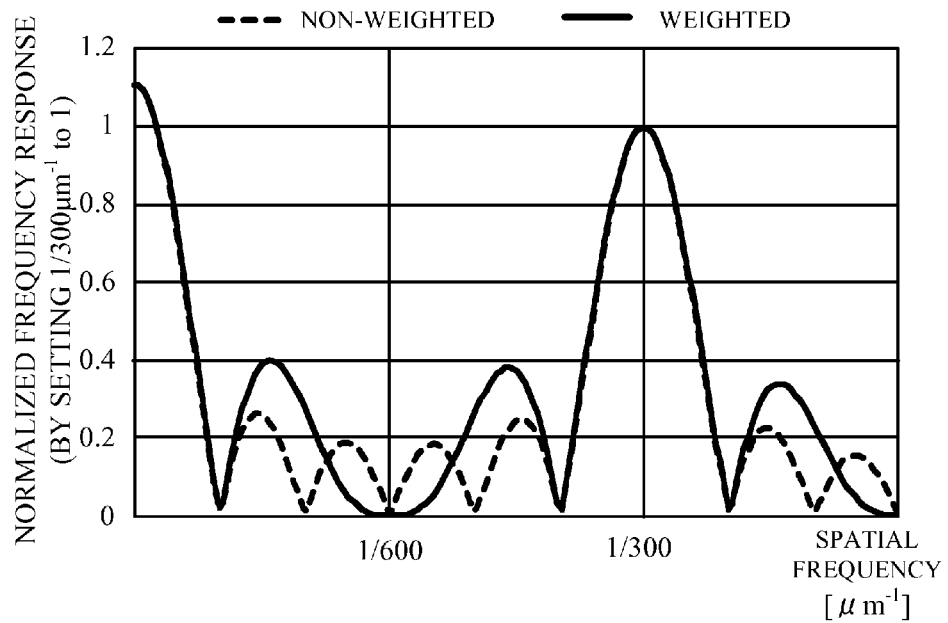
FIG. 16 is a plane view of a light receiving surface of a light receiving element array for explaining a reason of an effect of FIG. 15 according to the third embodiment.

FIG. 16 is a spatial frequency response graph of an A+ phase that compares a non-weighted output signal with a weighted output signal illustrated in FIG. 15. The abscissa axis denotes a spatial frequency [µm$^{-1}$] and the ordinate axis denotes a normalized frequency response (by setting $\frac{1}{500}$ µm$^{-1}$ to 1). The B+ phase, the A− phase, and the B− phase provide similar spatial frequency responses.

In FIG. 16, a broken line denotes the non-weighted output signals of the plurality of light receiving elements 17D and a solid line denotes the output signals of the plurality of light receiving elements 17D weighted using a weight in accordance with the phase of P2.

According to the weighting of this embodiment, it is understood that the frequency response reduces near the spatial frequency $\frac{1}{600}$ [µm$^{-1}$] corresponding to the pattern frequency of the area 25 in a wide range.

Fourth Embodiment

Figure 17:
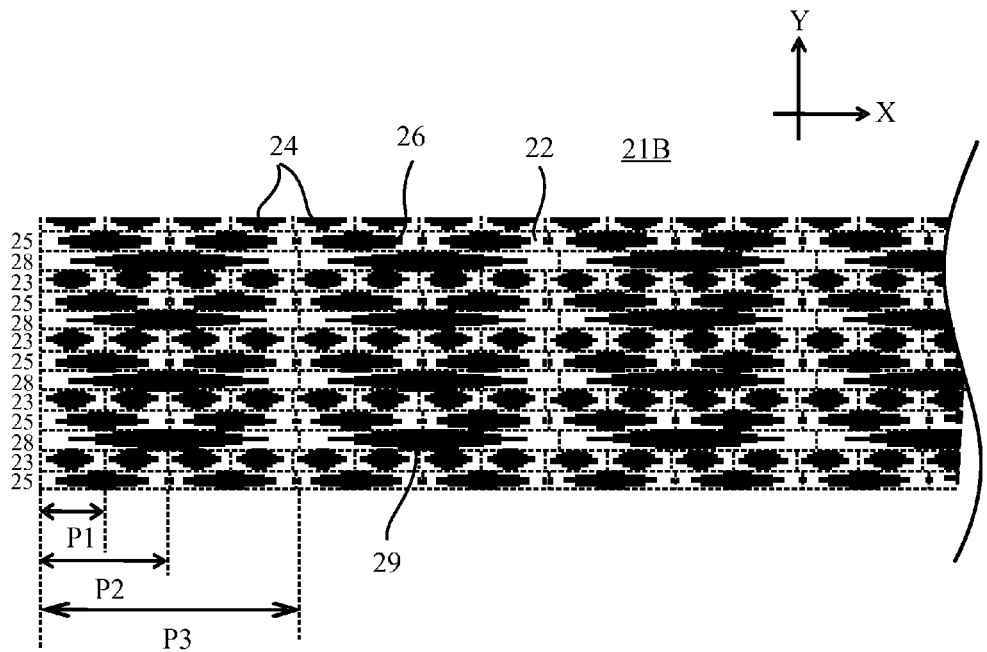
FIG. 17 is a partially enlarged plane view of a track according to a fourth embodiment.

The fourth embodiment is different from the first embodiment in that this embodiment uses a track 21B instead of the track 21A and a light receiving IC 14E instead of the light receiving IC 14A for the encoder illustrated in FIG. 1. FIG. 17 is a partially enlarged plane view of the track 21B.

In the track 21B, three types of areas (23, 25, and 28) alternate in the Y direction perpendicular to the moving direction (X direction) of the scale 20, and one track is set to a range that contains the overall width illustrated in FIG. 17 (that can be scanned on the light receiving surface of the light receiving array 16E).

The area 23 includes a pattern row in which a pattern illustrated in FIG. 3 is arranged every pitch P1 in the X direction (which is 127.204969 µm). The width W1 of the area 23 is 50 µm in the Y direction. Similar to the first embodiment, a width of the reflector 24 in the X direction differs according to a position of the area 23 in the Y direction.

The area 25 includes a pattern row in which the pattern illustrated in FIG. 4 is arranged every pitch P2 (=256 µm) in the X direction. A width W2 of the area 25 is 50 µm in the Y direction. Similar to the first embodiment, a width of each of the reflectors 26, 29 in the X direction differs according to a position of the area 25 in the Y direction.

Figure 18:
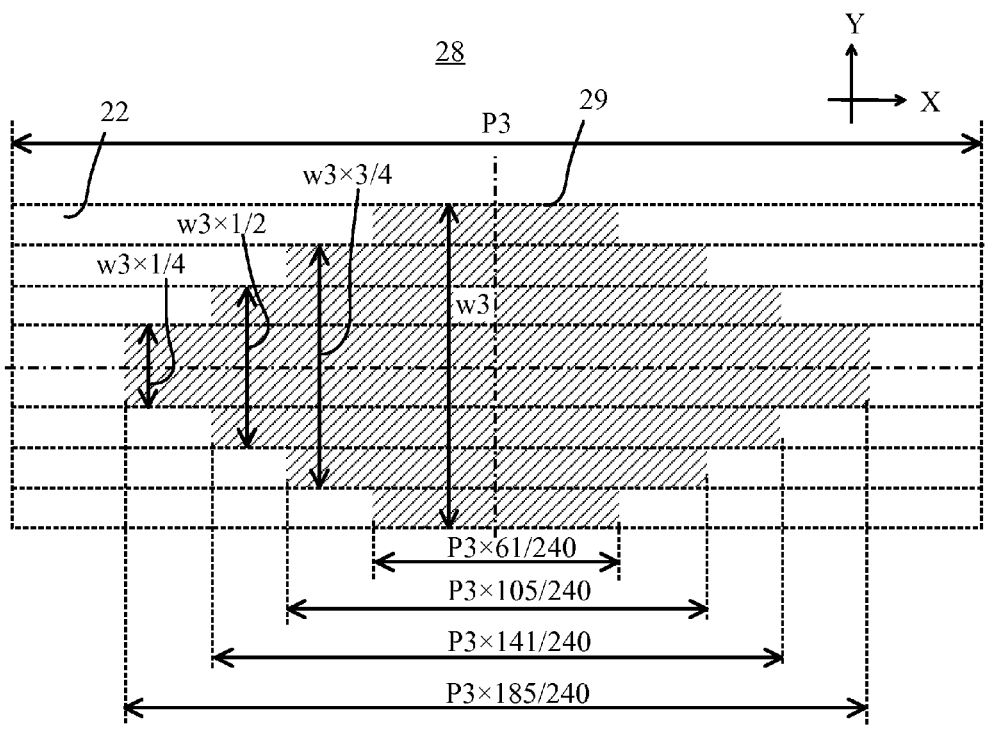
FIG. 18 is a partially enlarged plane view of FIG. 17 according to the fourth embodiment.

FIG. 18 is an enlarged plane view of the area in the X direction for one period. The area 28 includes a pattern row in which the pattern illustrated in FIG. 18 is arranged every pitch P3 (=553.513514 µm) in the X direction. Each pattern includes the non-reflector 22 and a reflector 29 that is made of a reflective film and configured to reflect light. A width W3 of the area 28 is 50 µm in the Y direction.

A width of the reflector 29 in the X direction differs according to a position of the area in the Y direction. In an area distant by a distance of w3·⅛ or less from the center in the Y direction, the width of the reflector 29 is P3·$^{185}/_{240}$ in the X direction. In an area distant by a distance of w3·⅛ to w3·¼ from the center in the Y direction, the width of the reflector 29 is P3·$^{141}/_{240}$ in the X direction. In an area distant by a distance of w3·¼ to w3·⅜ from the center in the Y direction, the width of the reflector 29 is P3·$^{105}/_{240}$ in the X direction. In an area distant by a distance of w3·⅜ to w3·½ from the center in the Y direction, the width of the reflector 29 is P3·$^{61}/_{240}$ in the X direction.

Figure 19A:
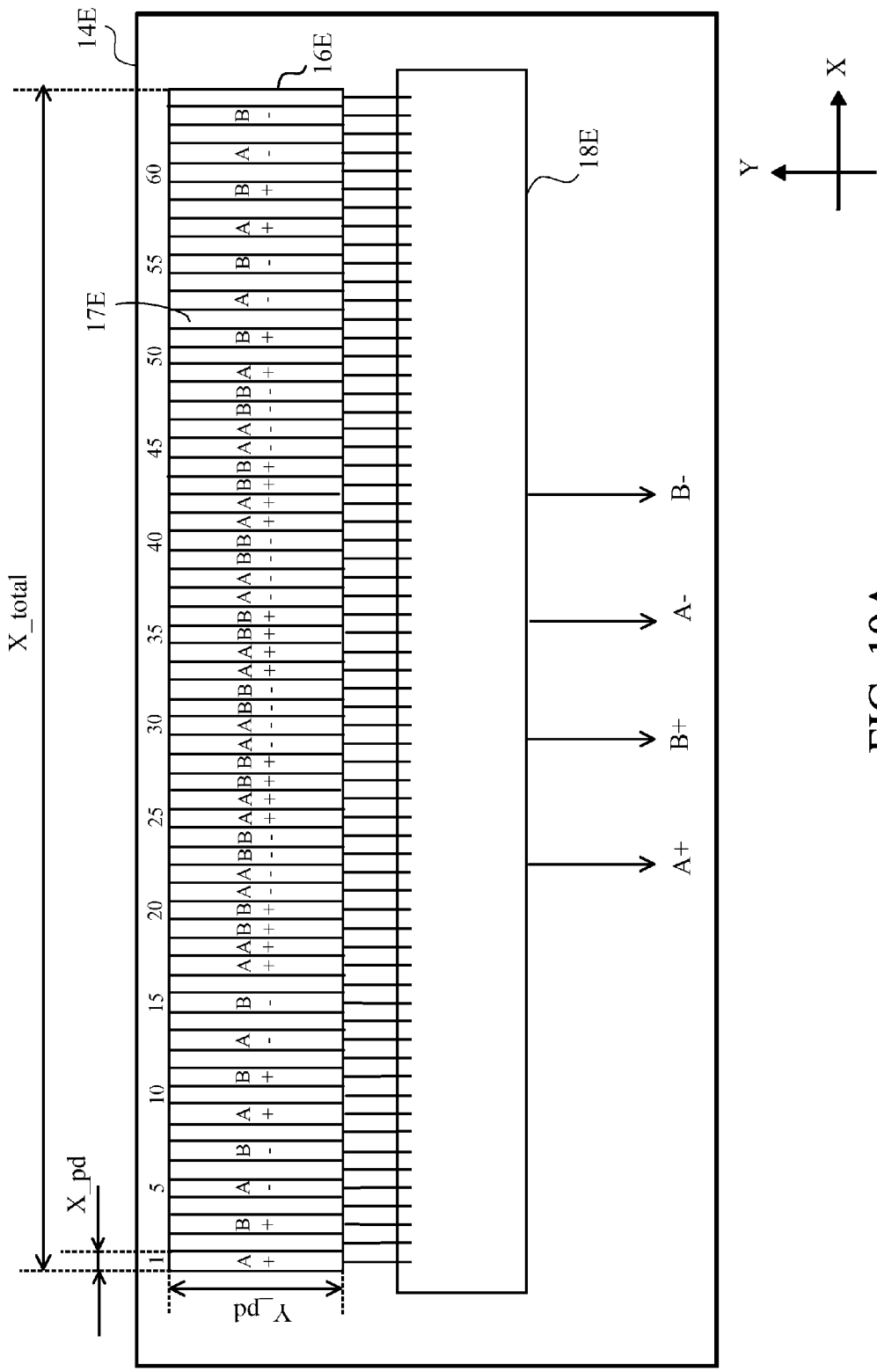
FIGS. 19A-19C are plane views of a light receiving surface of a light receiving element array according to the fourth embodiment.
Figure 19B:
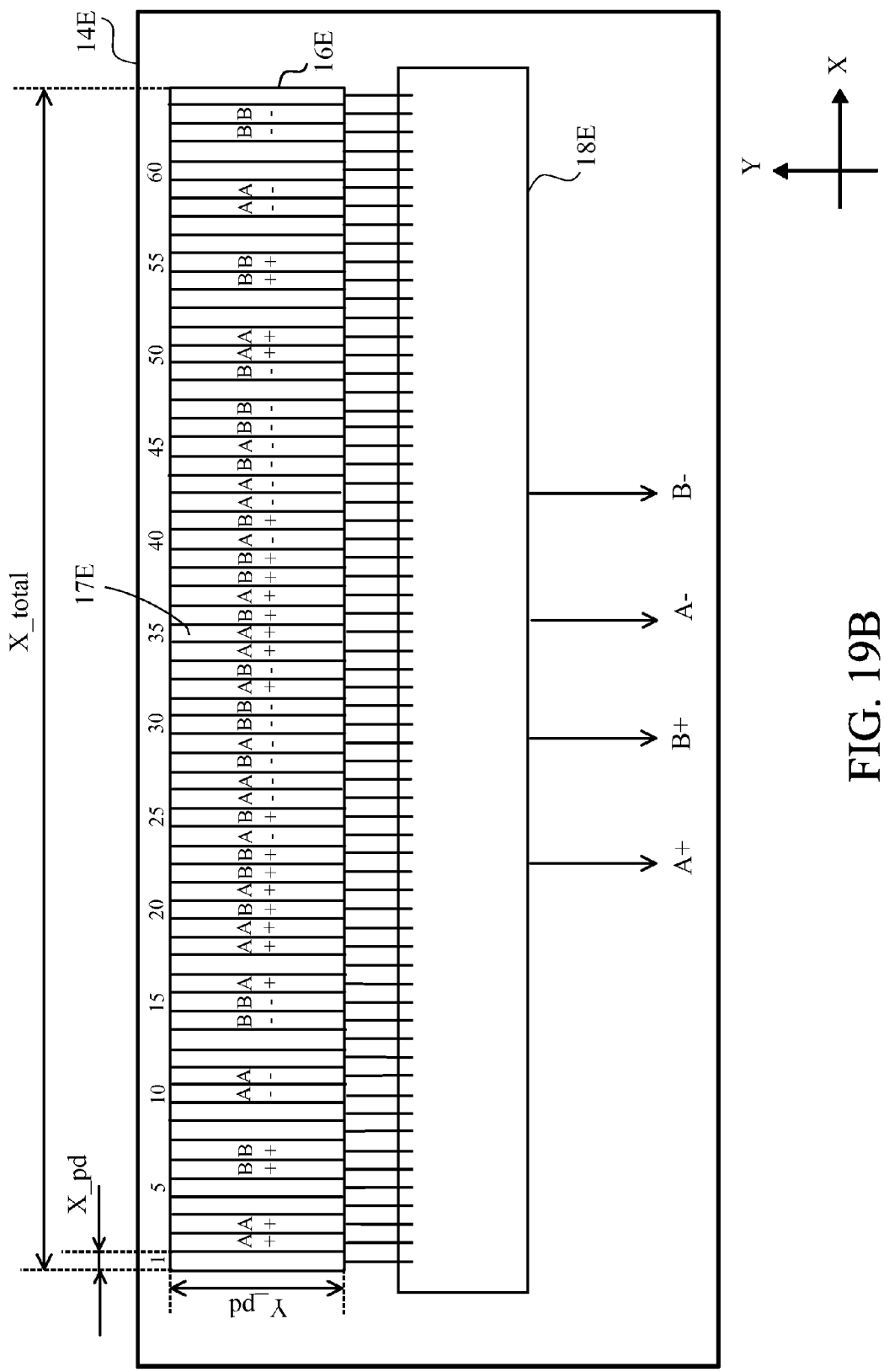
Figure 19C:
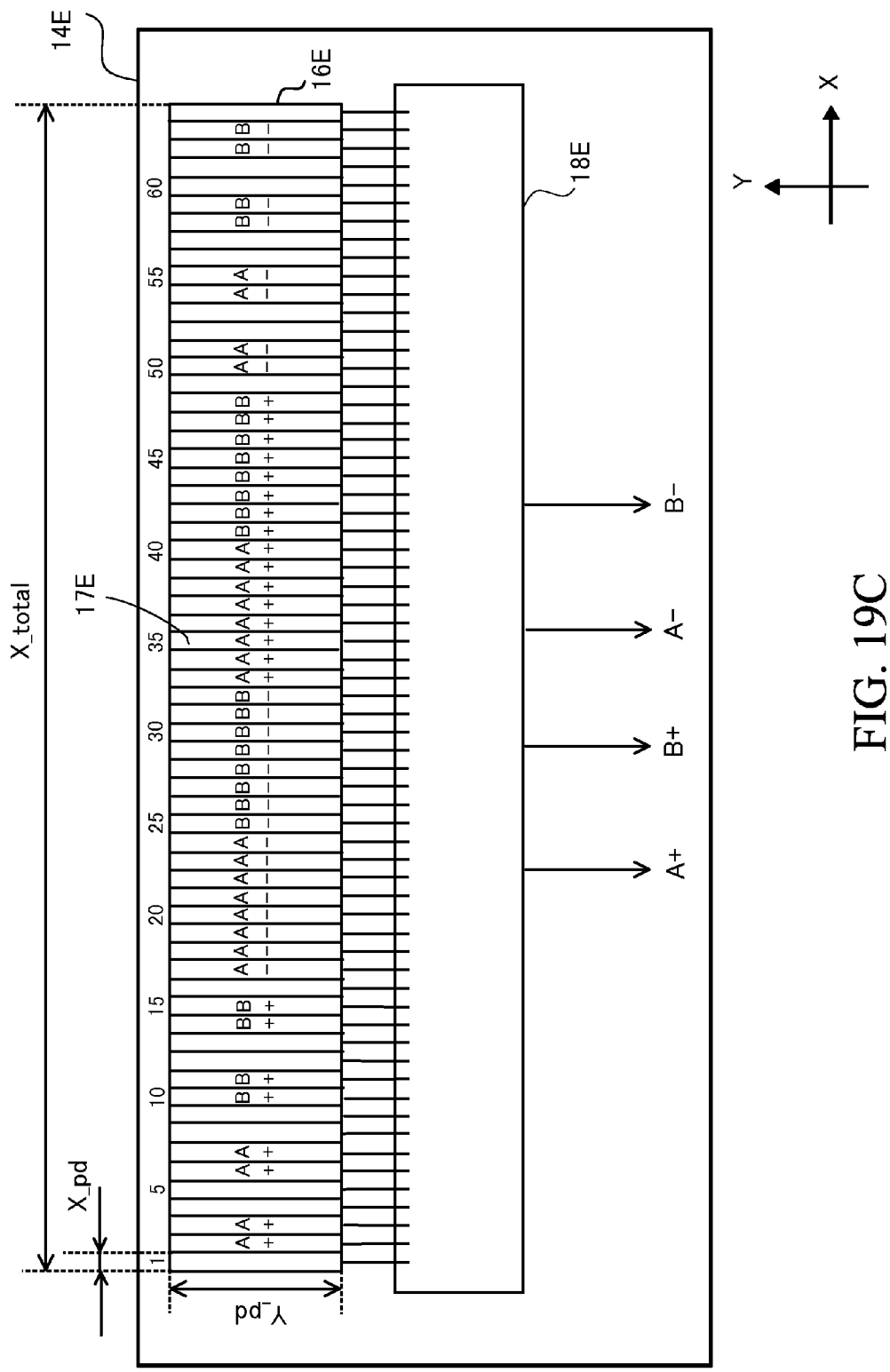

FIGS. 19A, 19B and 19C are plane views of the light receiving surface of the light receiving element array 16E in the light receiving IC 14E. In the light receiving element array 16E, sixty-four light receiving elements 17E are arranged with a pitch of 32 µm in the X direction: One light receiving element 17E has a width X_pd of 32 µm in the X direction, and a width Y_pd of 900 µm in the Y direction. An overall width X_total of the light receiving element array 16E is 2,048 µm.

Since the projected pattern on the scale is magnified twice, the detectable range on the scale is 450 µm in the Y direction and 1,024 µm in the X direction. Hence, the detectable range on the scale contains four lines in the Y direction, and each line includes the area 23 with a pitch of 127.204969 µm in the position detecting direction, the area 25 with a pitch of 256 µm, and the area 28 with a pitch of 553.513514 µm.

An output from each light receiving element 17E is switched by a switching circuit 18, and selectively connected to the four subsequent preamplifiers (not illustrated). Corresponding light receiving elements 17E are connected to output terminals A+, B+, A−, and B− (representative of A+ phase, B+ phase A− phase and B− phase) of four preamplifiers, and the switching circuit 18E is configured to output four-phase sign wave outputs S(A+), S(B+), S(A−), and S(B−).

The switching circuit 18E can switch a connection between the light receiving element 17A and the output terminal on the basis of the input from the signal separator 31 in the signal processor 30. As a result, an electrically added interval is switched in the plurality of light receiving elements 17E.

When the input from the signal processing circuit 30 has a high level, the detecting pitch becomes a pattern with a pitch of 128 µm (reflected image period of 256 µm), as illustrated in FIG. 19A. As a result, the periodic signal from the area 23 can be separated.

When the input from the signal processing circuit 30 has a low level, the detecting pitch becomes a pattern with a pitch of 256 µm (reflected image period of 512 µm), as illustrated in FIG. 19B. As a result, the periodic signal from the area 25 can be separated.

When the input from the signal processing circuit 30 has a middle level, the detecting pitch becomes a pattern with a pitch of 512 µm (reflected image period of 1,024 µm), as illustrated in FIG. 19C. As a result, the periodic signal from the area 28 can be separated.

With respect to the detecting pitch, relative phases of the four-phase sine wave signals have the following relationship with S(A+) as a reference: S(B+) shifts by about +90°, S(A−) shifts by about +180° and S(B−) shifts by about +270°.

The signal processor 30 generates two-phase sine wave signals S(A) and S(B) in which a DC component is eliminated, by performing Expressions 1 and 2 for the four-phase sine wave outputs S(A+), S(B+), S(A−), and S(B−).

When the input has a high level, an area of the light receiving element array of each phase corresponding to an individual period is two each at the center of the light receiving surface and one each at the periphery, as in FIG. 19A. Thus, this embodiment includes a weighting unit in a sensor unit 10A similar to the first embodiment.

Figure 20:
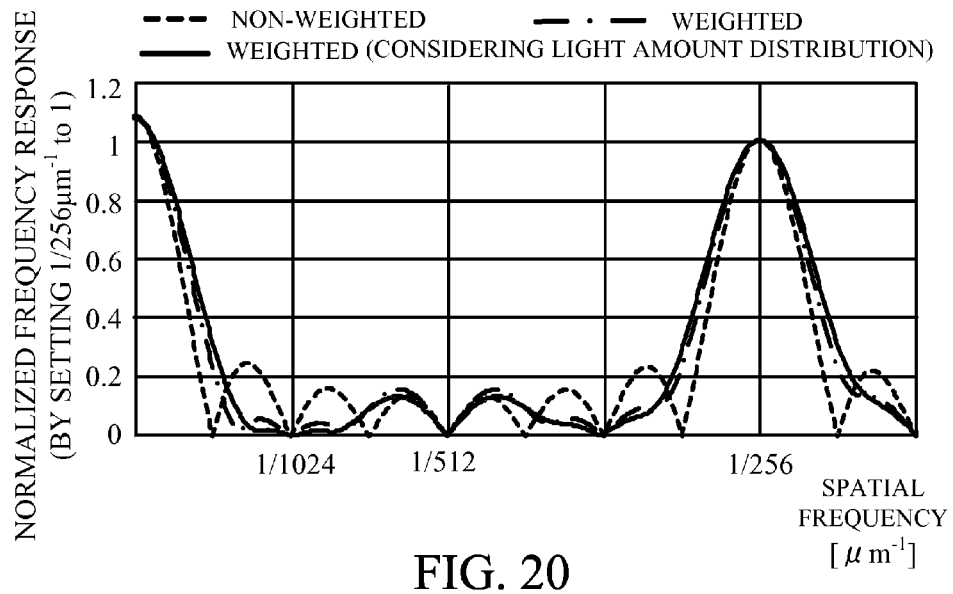
FIG. 20 is a spatial frequency response graph of an A+ phase that compares a non-weighted output signal with a weighted output signal illustrated in FIG. 19A according to the fourth embodiment.

FIG. 20 is a spatial frequency response graph of an A+ phase that compares a non-weighted output signal with a weighted output signal illustrated in FIG. 19A. The abscissa axis denotes a spatial frequency [µm$^{-1}$] and the ordinate axis denotes a normalized frequency response (by setting $\frac{1}{256}$ μm$^{-1}$ to 1). The B+ phase, the A− phase, and the B− phase provide similar spatial frequency responses.

In FIG. 20, a broken line denotes the non-weighted output signals of the plurality of light receiving elements 17E, and an alternate long and short dash line denotes the output signals of the plurality of light receiving elements 17E weighted using a weight in accordance with the phase of P3 or the position on the light receiving element array. In FIG. 20, a solid line denotes the weighted output signal in which a light amount distribution is considered.

Figure 21:
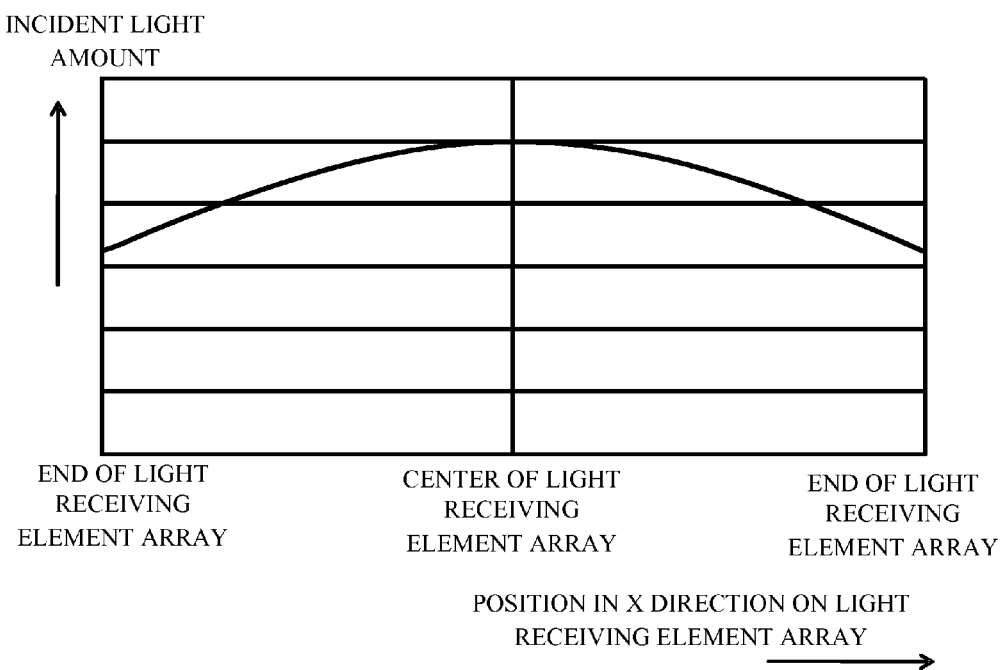
FIG. 21 is a graph of a light amount distribution caused by a luminous distribution of a light source according to the fourth embodiment.

According to the weighting of this embodiment, it is understood that the frequency response reduces near the spatial frequency of $1/1024$ [μm$^{-1}$] corresponding to the pattern frequency of the area 28 in a wide range. Now assume that the light amount incident upon the light receiving element array 16E is not uniform, and has a light amount distribution caused by the luminous distribution of the light source 12 illustrated in FIG. 21. Since this embodiment designs a weight in accordance with the actual light amount distribution, the attenuation effect becomes higher near the spatial frequency of $1/1024$ [μm$^{-1}$] when there is the light amount distribution, as illustrated in the solid line (weighted and the light amount distribution considered) of FIG. 20.

As illustrated in FIG. 19B, when the input has a low level, an area of the light receiving element array of each phase corresponding to an individual period is four each at the center of the light receiving surface and two each at the periphery. In addition, the four units at the center do not include continuous light receiving elements but two at both ends are replaced with neighboring detection phases. This configuration makes the effective integration width becomes wider than using continuous four detection phases, and reduce influence of the periodic component in the area 23.

Figure 22:
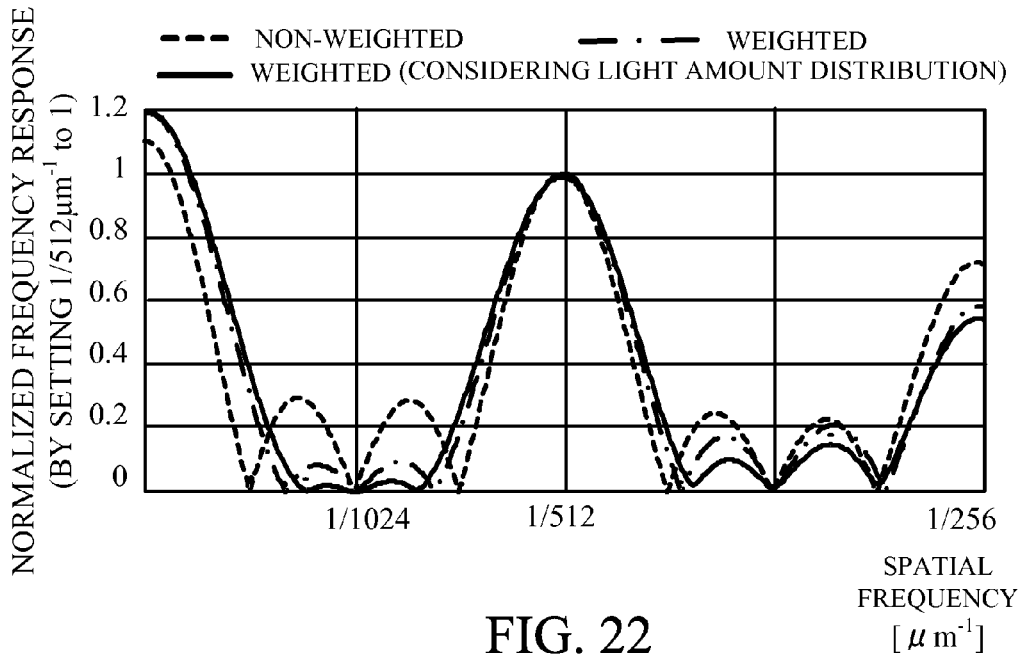
FIG. 22 is a spatial frequency response graph of an A+ phase that compares a non-weighted output signal with a weighted output signal illustrated in FIG. 19B according to the fourth embodiment.

FIG. 22 is a spatial frequency response graph of an A+ phase that compares a non-weighted output signal with a weighted output signal illustrated in FIG. 19B. The abscissa axis denotes a spatial frequency [μm$^{-1}$] and the ordinate axis denotes a normalized frequency response (by setting $1/512$ μm$^{-1}$ to 1). The B+ phase, the A− phase, and the B− phase provide similar spatial frequency responses.

In FIG. 22, a broken line denotes the non-weighted output signals of the plurality of light receiving elements 17E, and an alternate long and short dash line denotes the output signals of the plurality of light receiving elements 17E weighted using a weight in accordance with the phase of P3 or the position on the light receiving element array. In FIG. 22, a solid line denotes the weighted output signal in which a light amount distribution is considered.

According to the weighting of this embodiment, it is understood that the frequency response reduces near the spatial frequency of $1/1024$ [μm$^{-1}$] corresponding to the pattern frequency of the area 28 in a wide range. Now assume that the light amount incident upon the light receiving element array 16E is not uniform, and has a light amount distribution caused by the luminous distribution of the light source 12 illustrated in FIG. 21. Since this embodiment designs a weight in accordance with the actual light amount distribution, the attenuation effect becomes higher near the spatial frequency of $1/1024$ [μm$^{-1}$] when there is the light amount distribution, as illustrated in the solid line (weighted and the light amount distribution considered) of FIG. 22.

As illustrated in FIG. 19C, when the input has a middle level, an area of the light receiving element array of each phase corresponding to an individual period is eight each at the center of the light receiving surface and four each at the periphery. Since the input has a low level, S(A+) and S(A−) have almost the same phase components for the image with P1=256 μm and P1=127.204969 μm, the periodic components of the areas 23 and 25 are cancelled out and attenuated as a result of the subtraction. This is true of S(B).

Figure 23:
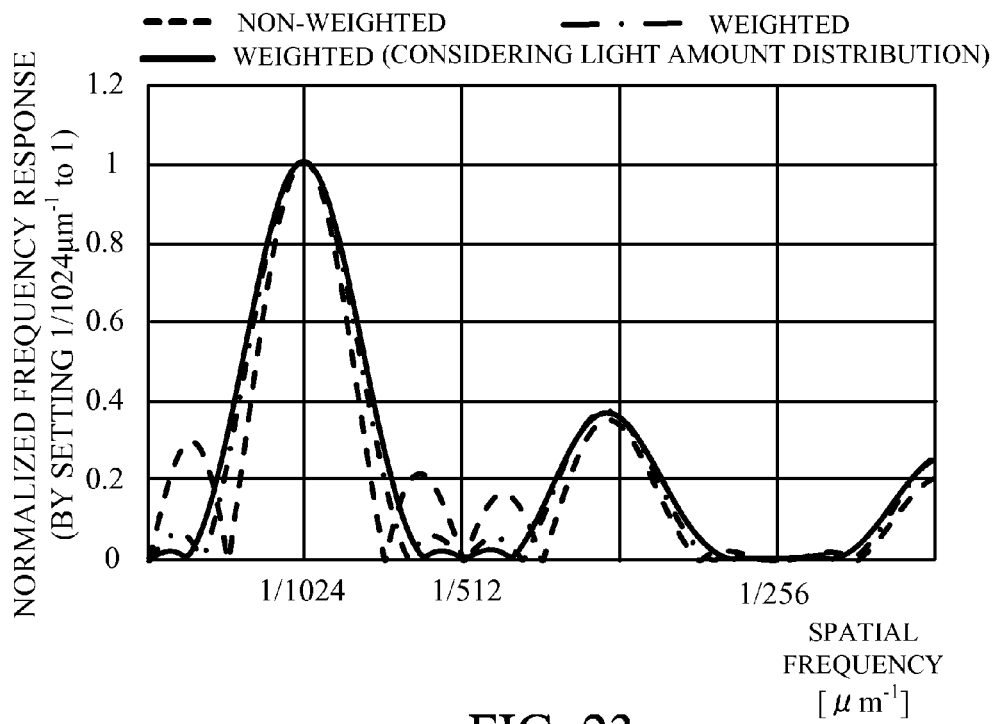
FIG. 23 is a spatial frequency response graph of an A+ phase that compares a non-weighted output signal with a weighted output signal illustrated in FIG. 19C according to the fourth embodiment.

FIG. 23 is a spatial frequency response graph after the subtraction between the A+ phase and the A− phase that compares a non-weighted output signal with a weighted output signal illustrated in FIG. 19C. The abscissa axis denotes a spatial frequency [μm$^{-1}$] and the ordinate axis denotes a normalized frequency response (by setting $1/1024$ μm$^{-1}$ to 1). A similar spatial frequency response is obtained after the subtraction between the B+ phase and the B− phase.

In FIG. 23, a broken line denotes the non-weighted output signals of the plurality of light receiving elements 17E, and an alternate long and short dash line denotes the output signals of the plurality of light receiving elements 17E weighted using a weight in accordance with the position on the light receiving element array. In FIG. 23, a solid line denotes the weighted output signal that considers light amount distribution.

According to the weighting of this embodiment, it is understood that the frequency response reduces near the spatial frequencies of $1/512$ [μm$^{-1}$] and $1/256$ [μm$^{-1}$] corresponding to the pattern frequency of the areas 23 and 25 in a wide range. Since this embodiment designs a weight in accordance with the actual light amount distribution, the attenuation effect becomes higher near the spatial frequencies of $1/512$ [μm$^{-1}$] and $1/256$ [μm$^{-1}$] when there is the light amount distribution, as illustrated in the solid line (weighted and the light amount distribution considered) of FIG. 23.

A description will be given of a detecting process flow of an absolute position. When the input into the switching circuit 18E has a high level, the phase signal $\Phi 1$ of the pitch P1 and the phase signal $\Phi 2$ of the pitch P2 are obtained based on Expressions 19 and 20 and S(A) and S(B). When the input into the switching circuit 18E has a middle level, the phase signal $\Phi 3$ of the pitch P3 is obtained based on the following expression and S(A) and S(B):

$$\Phi 3 = \text{ATAN } 2[S(A), S(B)] \quad \text{Expression 33}$$

In other words, $\Phi 1$ is a phase of a signal corresponding to the area 23 (with a period of 127.20497 μm). $\Phi 2$ is a phase of a signal corresponding to the area 25 (with a period of 256 μm). $\Phi 3$ is a phase of a signal corresponding to the area 28 (with a period of 553.51351 μm). Initial phases of the three periods on the scale 20 are set so that $\Phi 1 = \Phi 2 = \Phi 3 = 0$ is satisfied at one end (X=0 mm) of the moving range.

Next, phase signals $\Phi a$ and $\Phi b$ are obtained as follows:

$$\Phi a = \Phi 1 - 2 \cdot \Phi 2 \quad \text{Expression 34}$$

$$\Phi b = \Phi 2 - 2 \cdot \Phi 3 \quad \text{Expression 35}$$

Figure 24A:
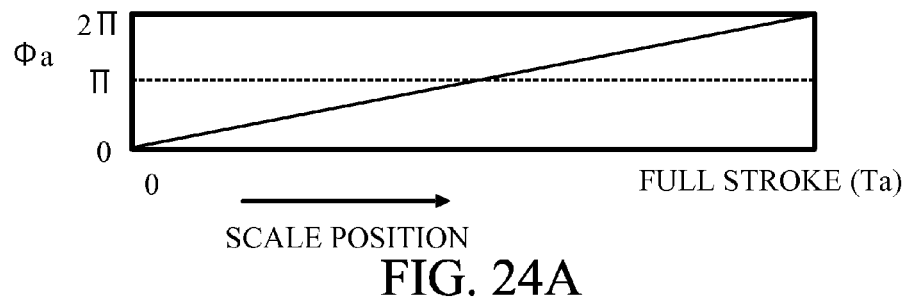
FIGS. 24A and 24B illustrate a relationship between a detection signal and a scale position according to the fourth embodiment.
Figure 24B:
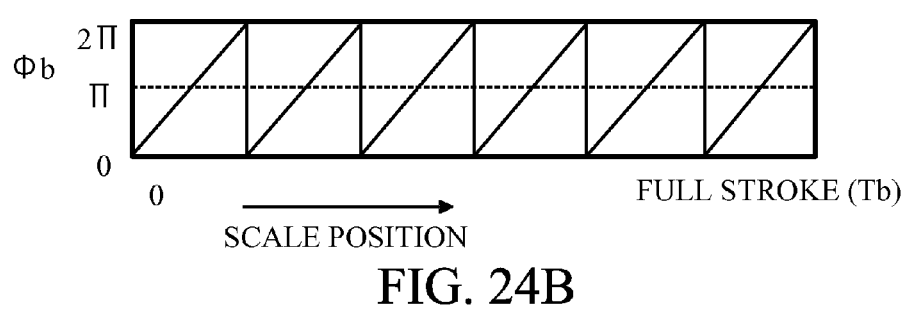

At this time, by repeating $\Phi a = \Phi a + 2\pi$ when $\Phi a < 0$ and $\Phi a = \Phi a - 2\pi$ when $\Phi a > 2\pi$, $\Phi a$ is converted into an output range between 0 and $2\pi$. This is true of $\Phi b$. The signal periods Ta and Tb for $\Phi a$ and $\Phi b$ in the X direction are Ta=20480 [μm] and Tb=3413.333 [μm]. FIG. 24A illustrates a relationship between $\Phi a$ and the scale position. FIG. 24B illustrates a relationship between $\Phi b$ and the scale position.

A description will now be given of processing to obtain information of an absolute position. The signal C corresponding to the above signal Sv is obtained as the phase signal $\Phi a$ and the detectable full stroke is Ta=20480 [μm].

Next, the signal processor 30 synchronizes the superordinate signal C with $\Phi b$, calculates, based on the superordinate signal C, which period of $\Phi b$ the current position corresponds to, and obtains an absolute position signal (medium signal M expressed by the following expression) having positional accuracy of $\Phi b$ by connecting $\Phi b$.

$$M = (2\pi \cdot \text{ROUND}[((Ta/Tb \cdot C - \Phi b)/(2\pi)] \Phi b) \cdot Tb/Ta \quad \text{Expression 36}$$

Herein, ROUND[x] is a function that converts a value into an integer closest to x.

Next, the signal processor 30 synchronizes the medium signal M with Φ3, calculates which period of Φ3 the current position is located at, using the medium signal M, and obtains an absolute position signal (subordinate signal F expressed in the following expression) having the positional accuracy of Φ3 by connecting Φ3.

$$F=(2\pi \cdot \text{ROUND}[((Ta/P3 \cdot M-\Phi 3)/(2\pi)]+\Phi 3) \cdot P3/Ta \qquad \text{Expression 37}$$

Next, the signal processor 30 synchronizes the subordinate signal F with Φ1, calculates which period of Φ1 the current position is located at, using the subordinate signal F, and obtains an absolute position signal ABS having the positional accuracy of Φ1 by connecting Φ1.

$$ABS=(\text{ROUND}[((Ta/P1 \cdot F-\Phi 1)/(2\pi)]+\Phi 1/(2\pi)) \cdot P1[\mu m] \qquad \text{Expression 38}$$

Due to this synthesizing processing, the absolute position of a long stroke can be detected with a precision of a highly precise incremental pattern signal.

Fifth Embodiment

A fifth embodiment is similar to the fourth embodiment except for using the light receiving IC 14F instead of the light receiving IC 14E.

Figure 25:
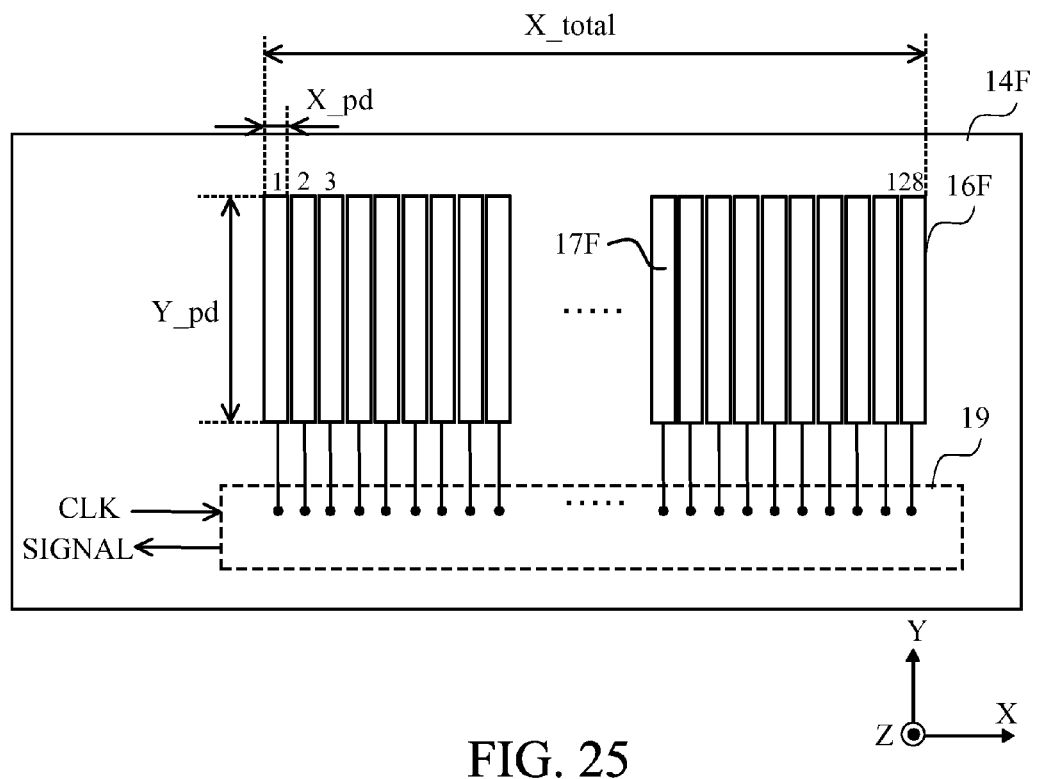
FIG. 25 is a plane view of a light receiving surface of a light receiving element array according to a fifth embodiment.

FIG. 25 is a plane view that illustrates an arrangement of a light receiving surface of the light receiving element array 16F in the light receiving IC 14F. The light receiving element array 16F is a so-called linear sensor array configured to sequentially take an output corresponding to a light receiving amount of each light receiving element in synchronization with the clock timing.

In the light receiving element array 16F, 128 light receiving elements 17F are arranged with a pitch X_pd of 16 μm in the X direction. Its width Y_pd is 900 μm in the Y direction, and the overall width X_total is 2,048 μm in the X direction.

Since a projected pattern on the scale is magnified twice, the detectable range on the scale is 450 μm in the Y direction and 1,024 μm in the X direction. Therefore, the detectable range on the scale contains the areas 23, 25, and 28 two lines each in the Y direction.

A method for separating each periodical signal component of each of the areas 23, 25, and 28 from a linear image signal V output from an output unit 19 of the light receiving element array 16F may use a conversion into four-phase sine waves corresponding to each period, as in the fourth embodiment. In that case, outputs of two neighboring light receiving elements in the light receiving element array 16F are summed up, replaced with the output of the light receiving element in the fourth embodiment for similar operations. At this time, the signal processor 30 performs proper weighting in accordance with the position of each light receiving element. Thus, this embodiment includes a weighting unit in the signal processor 30.

Φ1 is a phase of a signal corresponding to the area 23 (with a period of 127.20497 μm). Φ2 is a phase of a signal corresponding to the area 25 (with a period of 256 μm). Φ3 is a phase of a signal corresponding to the area 28 (with a period of 553.51351 μm). Initial phases of the three periods on the scale 20 are set so that Φ1=Φ2=Φ3=0 is satisfied at one end (X=0 mm) of the moving range.

A method for separating each periodic signal component of the areas 23, 25 and 28 using the linear image signal detected by the light receiving element array 16F may employ a Fourier transform. A description will now be given of processing of the signal processor 30 that performs the Fourier transform.

Initially, an average of outputs of 128 light receiving elements 17F is subtracted as a DC component from an output of each light receiving element. Moreover, the light receiving element array 16F is divided into 64 light receiving elements at the center (central part) and 32 light receiving elements at each of both ends (peripheral part). Each of the outputs of the central part and the peripheral part is multiplied by a different coefficient for weighting, and 128 data are Fourier-transformed. Φ1, Φ2, and Φ3 are calculated from the phase obtained by the Fourier transform and the corresponding spatial frequency.

The frequency resolution of the Fourier transform becomes $\Delta f=1/1024$ (μm$^{-1}$) as the spatial frequency on the light receiving surface, and thus does not perfectly accord with the pattern reflected image of the areas 23 and 28. For use with the subsequent operations, Φ1 is a phase of a component of $\Delta f \cdot 8=1/256$ (μm$^{-1}$), Φ2 is a phase of a component of $\Delta f \cdot 4=1/512$ (μm$^{-1}$), and Φ3 is a phase of a component of $\Delta f \cdot 2=1/1024$ (μm$^{-1}$).

While the signal processor 30 performs weighting for each area, an output of each light receiving element may have a different electric gain for each area.

The weighting ratio between the central part and the peripheral part may be fixed, for example, to a theoretical value of 3:1, and the ratio of the peripheral part may be increased depending upon the light distribution. Alternatively, a ratio may be determined by scanning a specific area and by minimizing the signal leakage from the area 28 (with a period of 553.51351 μm) into Φ1 and Φ2. A calculating method so as to detect an absolute position using thus obtained Φ1, Φ2, and Φ3 is similar to that of the third embodiment, and a description thereof will be omitted.

As described above, since this embodiment enables an output of each detector to be obtained using the linear sensor array, the design freedom improves in the subsequent weighting. In addition, since the signal is taken only once, the time synchronism improves among respective phases.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The present invention is not limited to the encoder of this embodiment, and is applicable to another apparatus incorporated with the encoder of the present invention, such as a lens apparatus, an image-pickup apparatus, a manufacturing apparatus, and an apparatus that contains a movable object or unit. The apparatus incorporated with the encoder may be referred to as a (position detecting) apparatus configured to detect a position. The apparatus incorporated with the encoder characteristically includes a movable unit that is movable relative to an apparatus body, and the encoder according to the present invention configured to detect a position of the movable unit (relative to the apparatus body). One illustrative example of the apparatus incorporated with the encoder is a lens apparatus that includes a zoom lens unit that is movable during zooming or a lens apparatus that includes a focusing lens unit that is movable during focusing. When the present invention is applied such a lens apparatus, the encoder of this embodiment can detect a position of the lens unit. Similarly, when the encoder of the present invention is applied to an apparatus, such as a facsimile machine, a printer, and a copier, configured to output or input a sheet of paper, the encoder of this embodiment can detect a position of the movable unit in the paper carrying system in the apparatus. When the encoder of the present invention is applied to a manufacturing apparatus used for a factory, such as a processing machine or a belt conveyor, the encoder of this embodiment can detect a position of a movable unit, such as a stage, a tool, or a belt in the manufacturing apparatus body. In the other apparatus that includes a movable object or unit, the encoder of this embodiment can detect a position of the movable object.

This application claims the benefit of Japanese Patent Application No. 2011-089795, filed Apr. 14, 2011, which is hereby incorporated by reference herein in its entirety.

What is claimed is:

1. An encoder comprising:
   a scale that includes a pattern row that has a plurality of patterns configured to spatially modulate an energy distribution;
   a detector array that includes plural detectors that are configured to detect the energy distribution from the pattern row and arranged in a moving direction, the detector array being configured to move relatively to the scale; and
   a signal processor configured to process and convert into positional information, an output signal from the detector array,
   wherein the pattern row has a first modulation period and a second modulation period different from the first modulation period in the moving direction, and
   wherein the signal processor includes a first phase acquirer configured to acquire a first phase of the first modulation period based on the output signal of the detector array,
   wherein the encoder further comprises a weighting unit configured to weight an output signal from each of the plural detectors using, for each of the plural detectors, a respective weight that is determined in accordance with a position of the each of the plural detectors, and
   wherein, for each of the plural detectors, the respective weight is set so that, in a predetermined range that contains a spatial frequency corresponding to the second modulation period, a value of a spatial frequency response of the first phase acquirer when the output signal from each of the plural detectors is weighted by the weighting unit is smaller than that when the output signal from each of the plural detectors is not weighted by the weighting unit.

2. The encoder according to claim 1, wherein the weight is an area of the light receiving surface of each of the plurality of detectors configured to detect the first modulation period, which differs according to a position of the detector array.

3. The encoder according to claim 1, wherein the weight is an electric gain of each of the plurality of detectors configured to detect the first modulation period, which differs according to a position of the detector array.

4. The encoder according to claim 1, wherein the pattern row includes a first area having a first pitch in the moving direction, and a second area having a second pitch different from the first pitch in the moving direction, the first area and the second area being periodically arranged in a direction perpendicular to the moving direction, the first modulation period corresponding to the energy distribution of the first area, and the second modulation period corresponding to the energy distribution of the second area.

5. The encoder according to claim 1, wherein the signal processor further includes a signal separator configured to separate the output signal from the detector array into a signal corresponding to each modulation period of the pattern.

6. The encoder according to claim 5, wherein the signal separator switches an electrically added interval of the plurality of detectors.

7. The encoder according to claim 5, wherein the signal separator performs a fast Fourier transform for the output signal from the detector array.

8. The encoder according to claim 5, wherein the plurality of detectors includes:
   a plurality of first detectors configured to provide an output to the first phase acquirer; and
   a plurality of second detectors configured to provide an output to a second phase acquirer,
   wherein the first acquirer and the second acquirer simultaneously acquire outputs from the plurality of detectors.

9. A position detecting apparatus comprising:
   a movable unit; and
   an encoder configured to detect a position of the movable unit,
   wherein the encoder includes:
   a scale that includes a pattern row that has a plurality of patterns configured to spatially modulate an energy distribution;
   a detector array that includes plural detectors that are configured to detect the energy distribution from the pattern row and arranged in a moving direction, the detector array being configured to move relatively to the scale; and
   a signal processor configured to process and convert into positional information, an output signal from the detector array,
   wherein the pattern row has a first modulation period and a second modulation period different from the first modulation period in the moving direction, and
   wherein the signal processor includes a first phase acquirer configured to acquire a first phase of the first modulation period based on the output signal of the detector array,
   wherein the encoder further comprises a weighting unit configured to weight an output signal from each of the plural detectors using, for each of the plural detectors, a respective weight in accordance with a position of the each of the plural detectors, and
   wherein, for each of the plural detectors, the respective weight is set so that, in a predetermined range that contains a spatial frequency corresponding to the second modulation period, a value of a spatial frequency response of the first phase acquirer when the output signal from each of the plural detectors is weighted by the weighting unit is smaller than that when the output signal from each of the plural detectors is not weighted by the weighting unit.

10. An encoder comprising:
    a scale that includes a pattern row that has a plurality of patterns configured to spatially modulate an energy distribution;
    a detector array that includes plural detectors that are configured to detect the energy distribution from the pattern row and arranged in a moving direction, the detector array being configured to move relatively to the scale, the detector array including a center portion and end portions, the center portion including a plurality of groups of detectors, each group of detectors being for a single phase, each group of detectors including a first number of detectors disposed consecutively, the end portions each including a second number of detectors for each phase, the second number being greater than or equal to one, and less than the first number;
    a signal processor configured to process and convert into positional information, the output signal from the detector array, wherein the pattern row has a first modulation period and a second modulation period different from the first modulation period in the moving direction, and wherein the signal processor includes a first phase acquirer configured to acquire a first phase of the first modulation period based on a sum of signals from the first number of detectors and a sum of signals from the second number of detectors.

11. The encoder according to claim 10, wherein a plurality of the second number of detectors are successively arranged at an end of the detector array.

12. The encoder according to claim 10, wherein each phase of the output signal from the detector array is weighted in accordance with a ratio of the first number to the second number.

13. A position detecting apparatus comprising:
a movable unit; and
an encoder configured to detect a position of the movable unit,
wherein the encoder includes:
a scale that includes a pattern row that has a plurality of patterns configured to spatially modulate an energy distribution;
a detector array that includes plural detectors that are configured to detect the energy distribution from the pattern row and arranged in a moving direction, the detector array being configured to move relatively to the scale, the detector array including a center portion and end portions, the center portion including a plurality of groups of detectors, each group of detectors being for a single phase, each group of detectors including a first number of detectors disposed consecutively, the end portions each including a second number of detectors for each phase, the second number being greater than or equal to one, and less than the first number;
a signal processor configured to process and convert into positional information, the output signal from the detector array,
wherein the pattern row has a first modulation period and a second modulation period different from the first modulation period in the moving direction, and
wherein the signal processor includes a first phase acquirer configured to acquire a first phase of the first modulation period based on a sum of signals from the first number of detectors and a sum of signals from the second number of detectors.

* * * * *